United States Patent
Sakamoto et al.

(10) Patent No.: US 7,176,487 B2
(45) Date of Patent: Feb. 13, 2007

(54) SEMICONDUCTOR INTEGRATED CIRCUIT

(75) Inventors: Noriaki Sakamoto, Kodaira (JP); Takehisa Yokohama, Higashiyamato (JP); Tomoru Sato, Fuchu (JP); Takafumi Kikuchi, Higashiyamato (JP); Fujio Ito, Hanno (JP)

(73) Assignee: Renesas Technology Corp., Tokyo (JP)

( * ) Notice: Subject to any disclaimer, the term of this patent is extended or adjusted under 35 U.S.C. 154(b) by 1 day.

(21) Appl. No.: 11/105,482

(22) Filed: Apr. 14, 2005

(65) Prior Publication Data
US 2005/0230796 A1    Oct. 20, 2005

(30) Foreign Application Priority Data
Apr. 16, 2004    (JP) ............................. 2004-121047

(51) Int. Cl.
*H01L 23/58*    (2006.01)
*G01R 31/26*    (2006.01)

(52) U.S. Cl. .................. 257/48; 257/522; 257/691; 257/735; 257/736; 257/E23.01; 257/E23.079; 324/765

(58) Field of Classification Search .............. 257/48, 257/522, 666, 691, 678, 723, 777, 735, 736, 257/E23.014, E23.079; 438/11–18, 611–618; 324/765
See application file for complete search history.

(56) References Cited

U.S. PATENT DOCUMENTS 5,808,877 A * 9/1998 Jeong et al. ................. 361/813
6,492,719 B2 * 12/2002 Miyamoto et al. .......... 257/686

FOREIGN PATENT DOCUMENTS

| JP | 06-151685 | 5/1994 |
| JP | 09-160802 | 6/1997 |
| JP | 10-123212 | 5/1998 |

\* cited by examiner

*Primary Examiner*—Jasmine Clark
(74) *Attorney, Agent, or Firm*—Antonelli, Terry, Stout and Kraus, LLP.

(57) ABSTRACT

To provide a test technology capable of reducing a package size by reducing a number of terminals (pins) in a semiconductor integrated circuit of SIP or the like constituted by mounting a plurality of semiconductor chips to a single package, in SIP 102 constituted by mounting a plurality of semiconductor chips to a signal package of ASIC 100, SDRAM 101 and the like, a circuit of testing SDRAM 101 (SDRAMBIST 109) is provided at inside of ASIC 100, and SDRAM 101 is tested from outside of SDRAM 101, that is, from ASIC 100. By providing the test circuit of SDRAM 101 at inside of ASIC 100, it is not necessary to extrude a terminal for testing SDRAM 101 to outside of SIP 102.

6 Claims, 23 Drawing Sheets

SEMICONDUCTOR INTEGRATED CIRCUIT

CROSS-REFERENCE TO RELATED APPLICATION

The present application claims priority from Japanese patent application No. 2004-121047 filed on Apr. 16, 2004, the content of which is hereby incorporated by reference into this application.

BACKGROUND OF THE INVENTION

1. Field of the Invention

The present invention relates to a semiconductor integrated circuit, particularly to a technology which is effective by being applied to a semiconductor integrated circuit having a plurality of semiconductor chips.

Further, the present invention relates to a semiconductor integrated circuit, particularly to a technology which is effective by being applied to a test of a semiconductor integrated circuit of SIP (System In Package) mounting a plurality of semiconductor chips on a single package.

2. Description of the Related Art

According to a multichip package (semiconductor integrated circuit) having a plurality of semiconductor elements (semiconductor chip) of a related art, a portion of a lead is extended from one side edge side to other side edge side without being brought into contact with a main face of at least one semiconductor element to thereby intersect the lead and the semiconductor element three-dimensionally and inner electrodes of the plurality of semiconductor elements are connected to a common lead by bonding wires (refer to, for example, Patent Reference 1).

Further, in a test of a semiconductor integrated circuit of SIP, it is necessary to carry out a leakage test of input/output terminals of a plurality of semiconductor chips (hereinafter, also referred to simply as "chip") mounted to, for example, SIP also for a terminal which does not output to outside of SIP. Hence, in a related art, in order to ensure performance of facilitating a test after having been integrated, all of terminals connecting the chips mounted to SIP are extruded to outside of SIP.

Further, there is a technology described in Patent Reference 2 as means for testing a memory in SIP including CPU and the memory. Further, there is a technology described in Patent Reference 3 as means for detecting a leakage current in noncontact for input/output terminals.

(Patent Reference 1) JP-A-6-151685 (FIG. 1)
(Patent Reference 2) JP-A-9-160802
(Patent Reference 3) JP-A-10-123212

There is known a semiconductor integrated circuit referred to as SIP including a semiconductor chip (hereinafter, also referred to as microcomputer chip) having a processing function and a semiconductor chip (hereinafter, also referred to as memory chip) having a memory circuit.

Although the main stream is constituted by SIP of a substrate type in view of a high degree of freedom of leading around wirings, the substrate type is accompanied by high cost.

Hence, the inventors have investigated on SIP of a frame type integrated by using a lead frame for reducing cost. As a result, there has been found a problem that in a multipins constitution, a semiconductor integrated circuit becomes more large-sized than in the substrate type.

Further, although Patent Reference 1 (JP-A-6-151685), mentioned above, describes a multichip package of a frame type, a technology of achieving small-sized formation of a semiconductor integrated circuit of a multipin type is not described.

Further, as a result of investigating a technology of testing semiconductor integrated circuit of SIP by the inventors, the following becomes apparent.

For example, according to an SIP product, also a terminal connecting chip which is not necessary for a customer is excluded to outside of the SIP in view of performance of facilitating a test after having been integrated and therefore, a number of terminals (pins) is increased and a package size tends to increase.

SUMMARY OF THE INVENTION

It is an object of the invention to provide a semiconductor integrated circuit capable of realizing multipin formation and a reduction in cost.

It is an object of the invention to provide a semiconductor integrated circuit capable of realizing small-sized formation and a reduction in cost.

Further, it is an object of the invention to provide a test technology capable of reducing a package size by reducing a number of external terminals in a semiconductor integrated circuit of SIP or the like mounted with a plurality of semiconductor chips on a single package.

Further, it is other object of the invention to provide a semiconductor integrated circuit capable of achieving thin-sized formation.

The above-described objects and other object and a novel characteristic of the invention will become apparent from a description of the specification and attached drawings.

A simple explanation will be given of an outline of a representative aspect of the invention disclosed in the application as follows.

That is, the invention includes a first semiconductor chip having a semiconductor element and a plurality of electrodes at a main face thereof, a second semiconductor chip including a semiconductor element and a plurality of electrodes at a main face thereof, arranged to be aligned laterally with the first semiconductor chip, a thickness thereof being thinner than a thickness of the first semiconductor chip, a first chip mounting portion connected to the first semiconductor chip, a second chip mounting portion connected to the second semiconductor chip, a plurality of leads arranged at surroundings of the first and the second semiconductor chips, a plurality of conductive first bonding wires for respectively electrically connecting the electrode of the first semiconductor chip and the electrode of the second semiconductor chip, a plurality of conductive second bonding wires for respectively electrically connecting the electrode of the first semiconductor chip and the lead, arranged to ride over the second semiconductor chip and formed with a loop at a position higher than a loop of the first bonding wire, and a seal member for sealing the first and the second semiconductor chips and the pluralities of first and second bonding wires by a resin.

Further, the invention includes a first semiconductor chip having a semiconductor element and a plurality of electrodes at a main face thereof, a second semiconductor chip having a semiconductor element and a plurality of electrodes at a main face thereof and arranged to be aligned laterally with the first semiconductor chip, a first chip mounting portion connected to the first semiconductor chip, a second chip mounting portion connected to the second semiconductor chip and formed to be thinner than the first chip mounting portion, a plurality of leads arranged at surroundings of the first and second semiconductor chips, a plurality of conductive first bonding wires for respectively electrically connecting the electrode of the first semiconductor chip and the electrode of the second semiconductor chip, a plurality of conductive second bonding wires for respectively electrically connecting the electrode of the first semiconductor chip and the lead, arranged to ride over the second semiconductor chip and formed with a loop at a position higher than a loop of the first bonding wire, and a seal member for sealing the first and second semiconductor chips and the plurality of the first and second bonding wires by a resin.

Further, the invention includes a first semiconductor chip having a semiconductor element and a plurality of electrodes at a main face thereof, a second semiconductor chip having a semiconductor element and a plurality of electrodes at a main face thereof and arranged to align laterally with the first semiconductor chip, a first chip mounting portion arranged in correspondence with the plurality of electrodes of the first semiconductor chip at lower portions thereof and connected to the first semiconductor chip, a second chip mounting portion arranged in correspondence with the plurality of electrodes of the second semiconductor chip at lower portions thereof and connected to the second semiconductor chip, a plurality of leads arranged at surroundings of the first and second semiconductor chips, a plurality of conductive first bonding wires for respectively electrically connecting the electrode of the first semiconductor chip and the electrode of the second semiconductor chip, a plurality of conductive second bonding wires for respectively electrically connecting the electrode of the first semiconductor chip and the lead, and a seal member for sealing the first and the second semiconductor chips and the plurality of first and second bonding wires by a resin, and a portion of a rear face of the first semiconductor chip and a portion of a rear face of the second semiconductor chip are respectively brought into close contact portions of the seal member.

Further, the invention includes a first semiconductor chip having a semiconductor element and a plurality of electrodes at a main face thereof, a second semiconductor chip having a semiconductor element and a plurality of electrodes at a main face thereof, arranged to be aligned laterally with the first semiconductor chip, a planer shape thereof being formed in a rectangular shape, a first chip mounting portion connected to the first semiconductor chip, a second chip mounting portion connected to the second semiconductor chip, a plurality of leads arranged at surroundings of the first and the second semiconductor chips, a plurality of conductive first bonding wires for respectively electrically connecting the electrode of the first semiconductor chip and the electrode of the second semiconductor chip, a plurality of conductive second bonding wires for respectively electrically connecting the electrode of the first semiconductor chip and the lead, and a seal member for sealing the first and the second semiconductor chips and the pluralities of first and second bonding wires by a resin, and a relationship between a distance P in a direction in parallel with a direction of a short side of the second semiconductor chip between a center in a planer direction of the first semiconductor chip and a center in a planer direction of the semiconductor integrated circuit and a length C of the short side of the second semiconductor chip is $P<(C/2)$.

Further, according to a semiconductor integrated circuit of the invention, in a semiconductor integrated circuit (SIP or the like) mounted with a plurality of semiconductor chips of the system chip (first semiconductor chip) and a memory chip (second semiconductor chip) on a single package, a test circuit (BIST or the like) of the memory chip is provided at inside of the system chip, and the memory chip is tested from outside of the memory chip, that is, from the system chip. By providing the test circuit of the memory chip at inside of the system chip, it is not necessary to extrude a terminal for testing the memory chip to outside of SIP.

Further, according to a semiconductor integrated circuit of the invention, with regard to a connecting terminal between chips of a plurality of semiconductor chips of a system chip and a memory chip mounted to a semiconductor integrated circuit of SIP or the like, leakage of the connecting terminal between chips is made to be able to be detected by changing from a circuit only of an input or an output buffer to an input/output buffer having a control signal input for either of the chips.

By changing to the input/output buffer having the control signal, in a test mode, after making the control signal ON and charging or discharging a charge of the connecting terminal between the chips to "0" or "1" level, when there is leakage of the charge at the charged or discharged terminal, a set value is not maintained, leakage of the connecting terminal can be detected and therefore, it is not necessary to extrude the terminal to outside of SIP for a leakage test.

A simple explanation will be given of an effect achieved by a representative aspect of the invention disclosed in the application as follows.

(1) In a semiconductor integrated circuit arranged with the first semiconductor chip and the second semiconductor chip to align laterally, by connecting the electrode of the first semiconductor chip and the electrode of the second semiconductor chip contiguous thereto by the first bonding wire and connecting the electrode of the first semiconductor chip and the inner lead by the second bonding wire arranged to ride over the second semiconductor chip, when the second semiconductor chip is the memory chip, an interface circuit of a bus for the memory is closed in the package only by connecting the chips by the first bonding wire without being connected to the external terminal. Thereby, the interface circuit of the bus for the memory is not connected to the external terminal and therefore, a pin therefor can be utilized to other function and multipin formation can be achieved. Further, by adopting the frame type, a reduction in cost of the semiconductor integrated circuit can be achieved.

(2) By providing the test circuit of the memory chip in the system chip, it is not necessary to extrude a terminal for testing the memory chip to outside of SIP and few terminal formation and small package formation can be achieved.

(3) In an SIP product, few terminal formation can be achieved by changing an existing input buffer or output buffer by a small scale (change to input/output buffer having a control signal input) for measuring leakage of a terminal.

(4) Low price formation can be achieved by enabling to further reduce also a package size by realizing few terminal formation by attaching a small scale circuit (input/output buffer having a control signal input) for measuring leakage of a terminal.

DESCRIPTION OF THE PREFERRED EMBODIMENTS

In the following embodiments, an explanation of the same of similar portion is not repeated as a rule unless particularly needed.

Further, although according to the following embodiments, an explanation will be given by being divided into a plurality of sections of embodiments when needed for convenience of an explanation, these are not unrelated to each other but one of them is brought into a relationship with a partial or a total modified example, detailed or supplementary explanation of other thereof except when clearly indicated.

Further, in the following embodiments, in referring to a number of elements (including number of pieces, numerical value, amount and range), a number is not limited to the particular number but may be equal to or larger than or equal to or smaller than the particular number except clearly indicated particularly and when limited to the particular number clearly in principle.

Embodiments of the invention will be explained in details in reference to the drawings as follows. Further, in total of the drawings for explaining the embodiments, members having the same functions are attached with the same notations and a repeated explanation thereof will be omitted.

(Embodiment 1)

Figure 1:
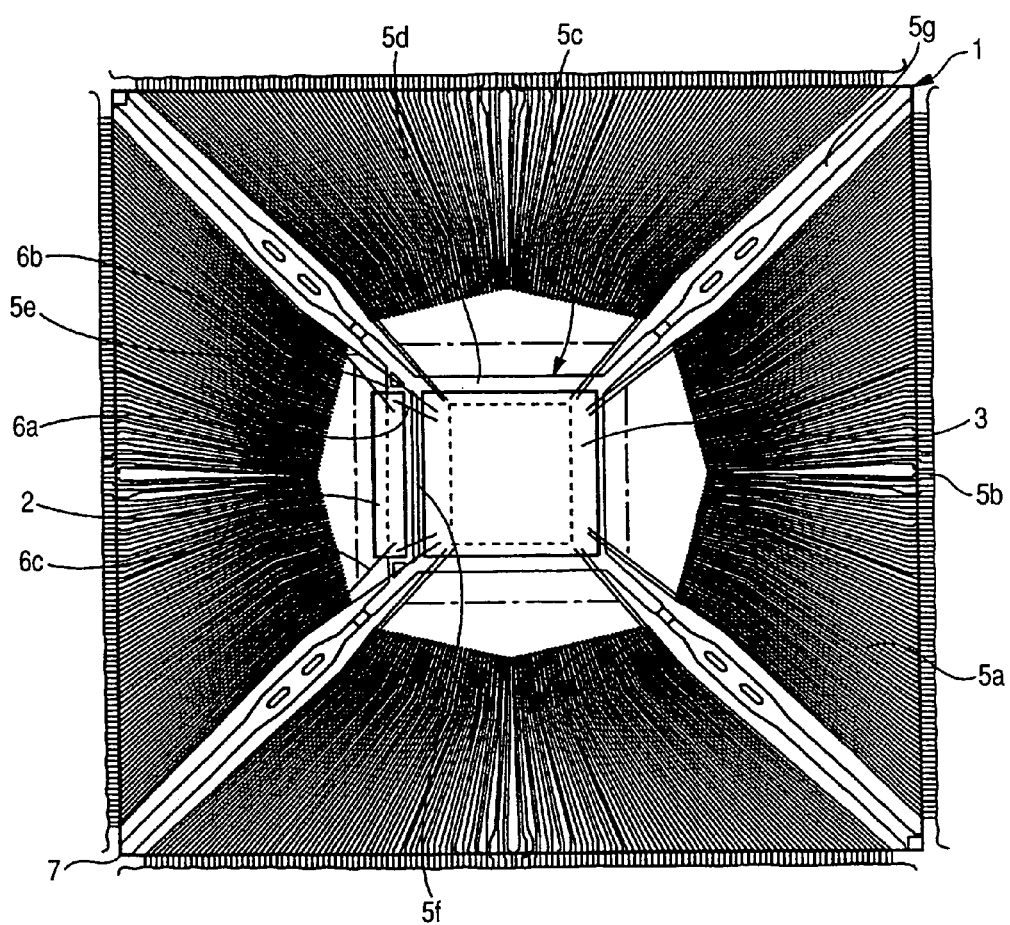
FIG. 1 is a partial plane view of showing an example of a structure of a semiconductor integrated circuit of Embodiment 1 of the invention by seeing through a seal member.
Figure 2:
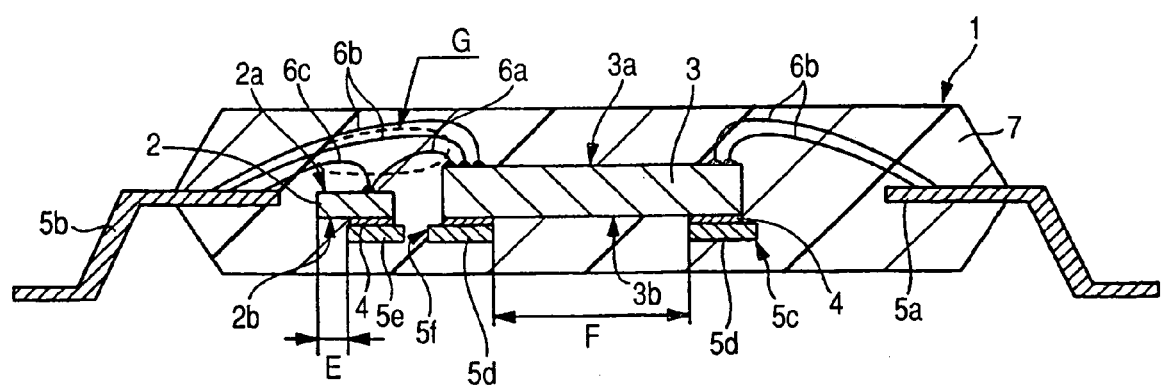
FIG. 2 is a sectional view showing the example of the structure of the semiconductor integrated circuit shown in FIG. 1.
Figure 3:
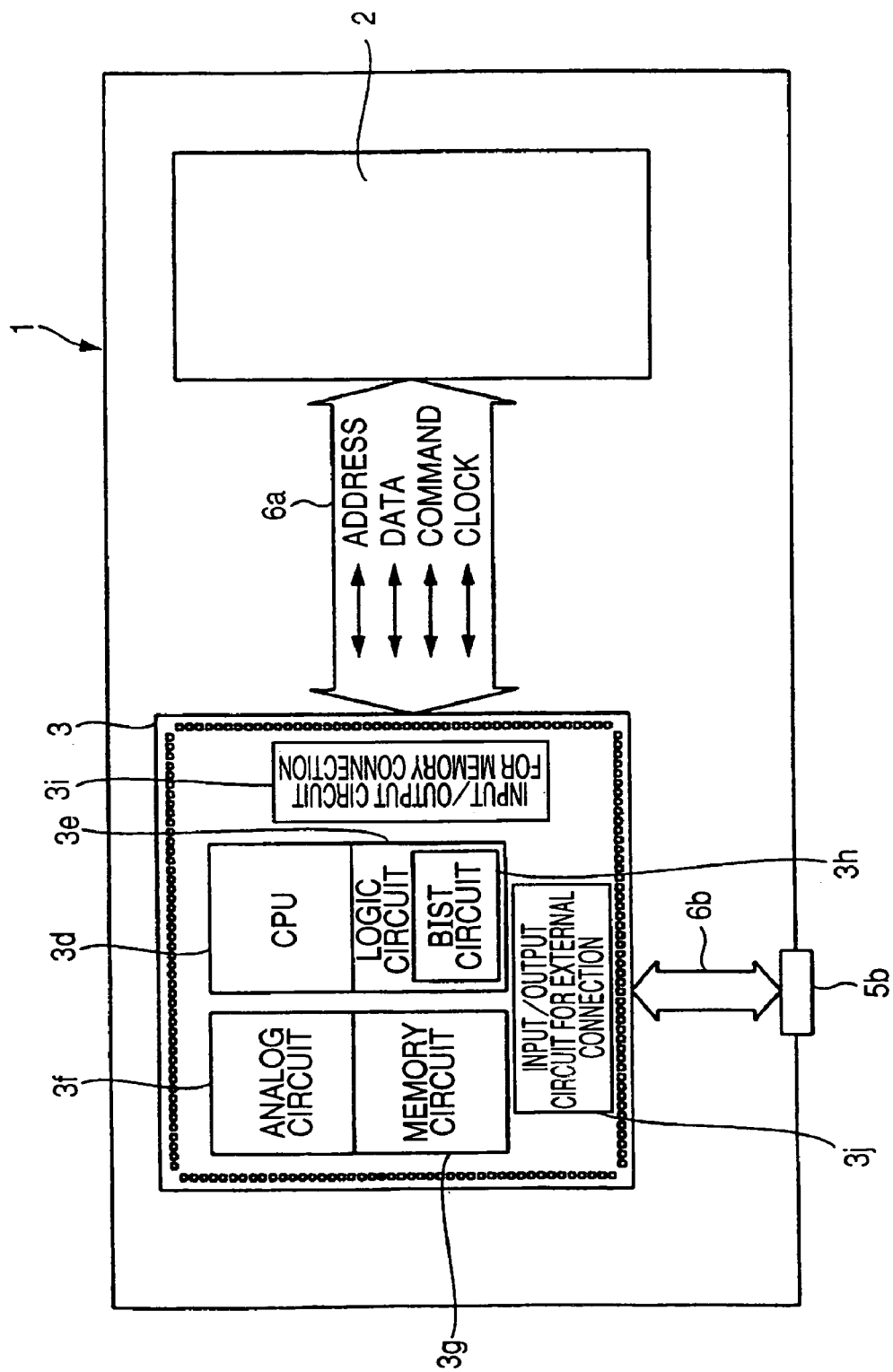
FIG. 3 is a block diagram showing an example of a system of the semiconductor integrated circuit shown in FIG. 1.
Figure 4:
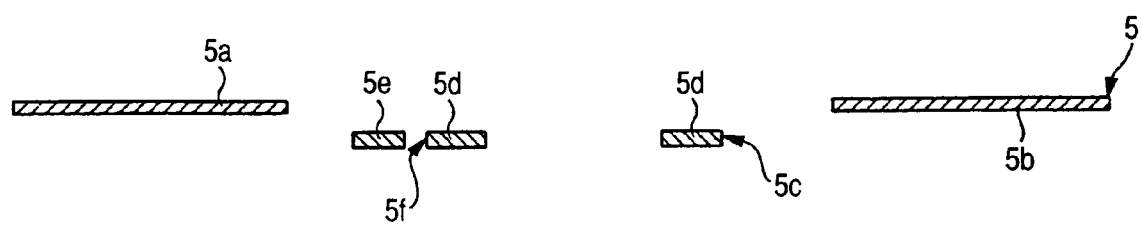
FIG. 4 is a sectional view showing an example of a structure of a lead frame used for integrating the semiconductor integrated circuit shown in FIG. 1.
Figure 5:
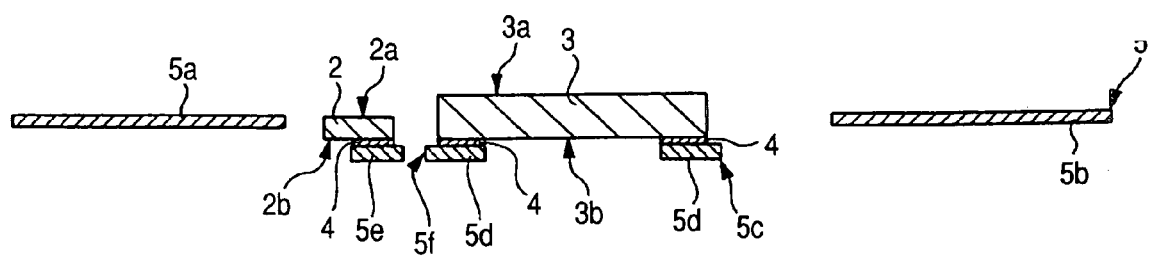
FIG. 5 is a sectional view showing an example of a structure in finishing die bonding in integrating the semiconductor integrated circuit shown in FIG. 1.
Figure 6:
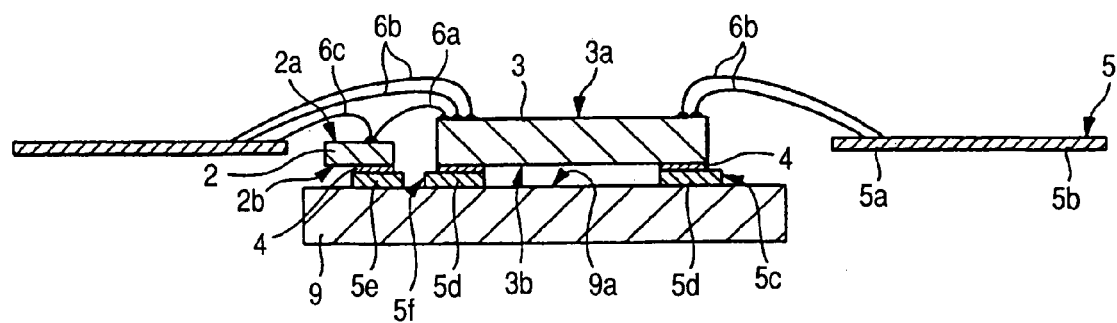
FIG. 6 is a sectional view showing an example of a structure in finishing wire bonding in integrating the semiconductor integrated circuit shown in FIG. 1.
Figure 7:
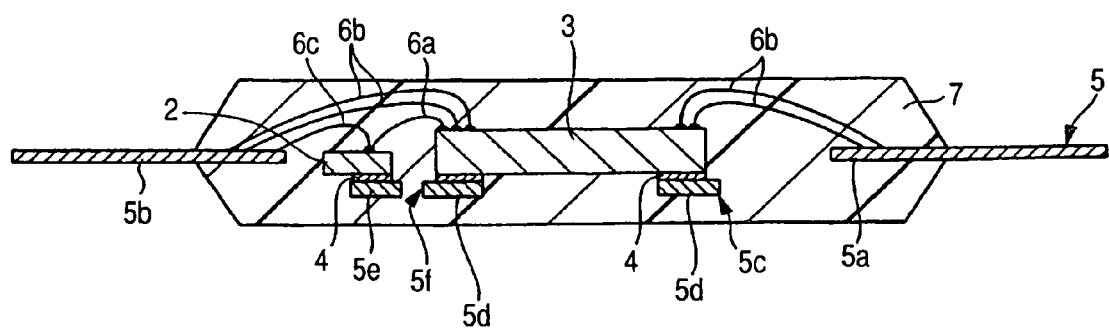
FIG. 7 is a sectional view showing an example of a structure in finishing to seal by a resin in integrating the semiconductor integrated circuit shown in FIG. 1.
Figure 8:
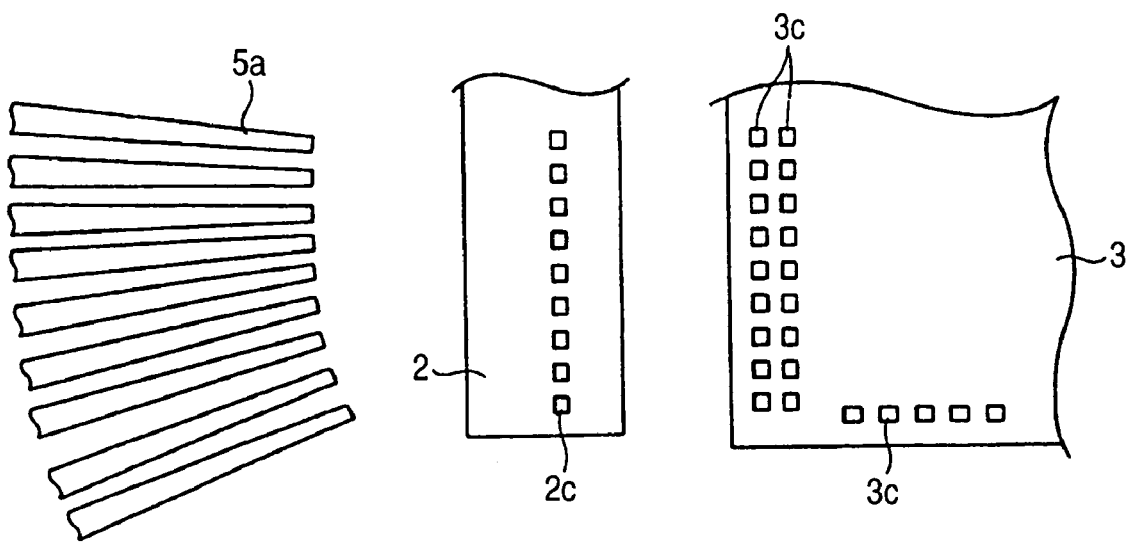
FIG. 8 is an enlarged partial plane view showing an example of a structure before bonding in wire bonding shown in FIG. 6.
Figure 9:
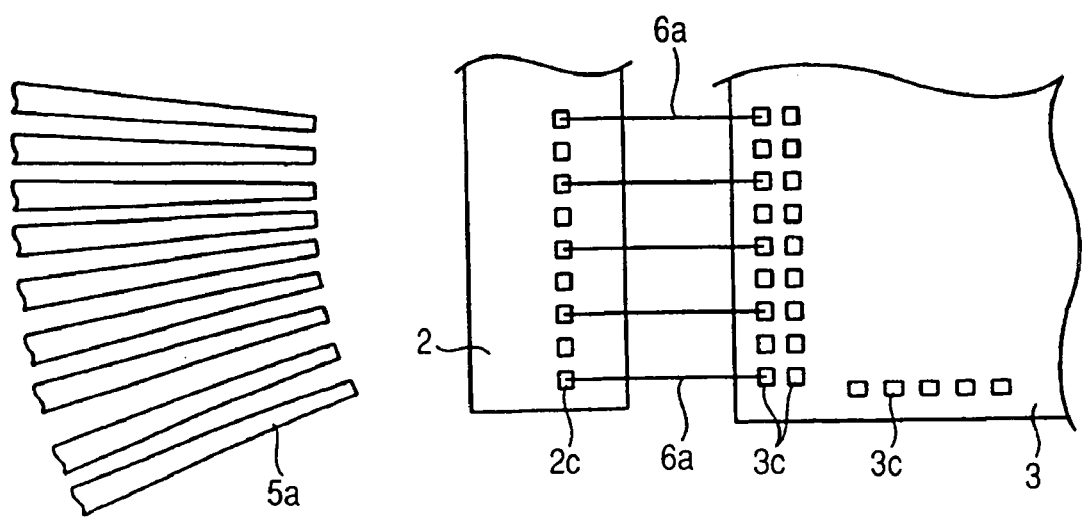
FIG. 9 is an enlarged partial plane view showing an example of a structure after connecting chips in wire bonding shown in FIG. 6.
Figure 10:
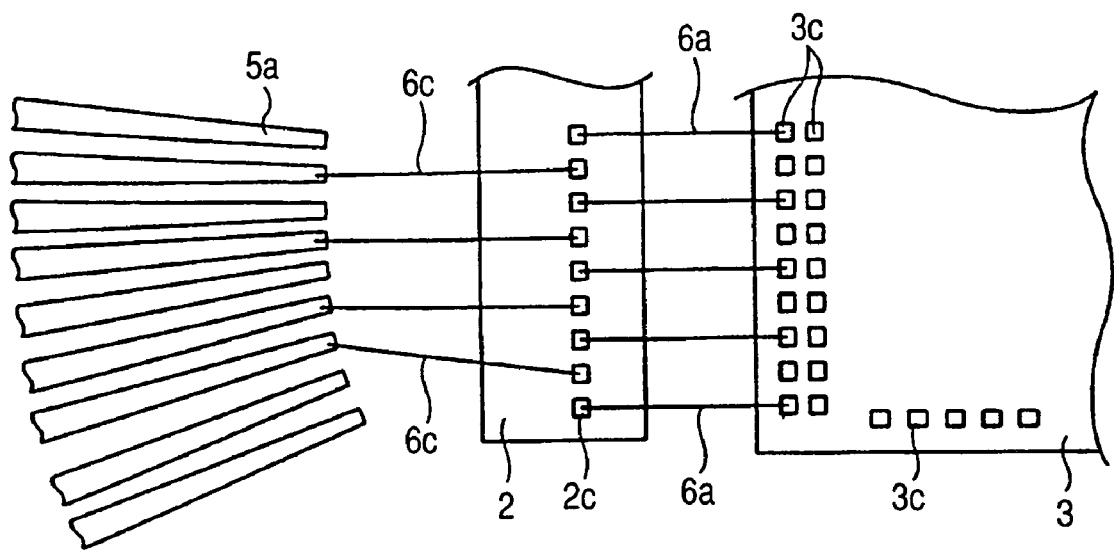
FIG. 10 is an enlarged partial plane view showing an example of a structure after connecting a second chip and a lead in wire bonding shown in FIG. 6.
Figure 11:
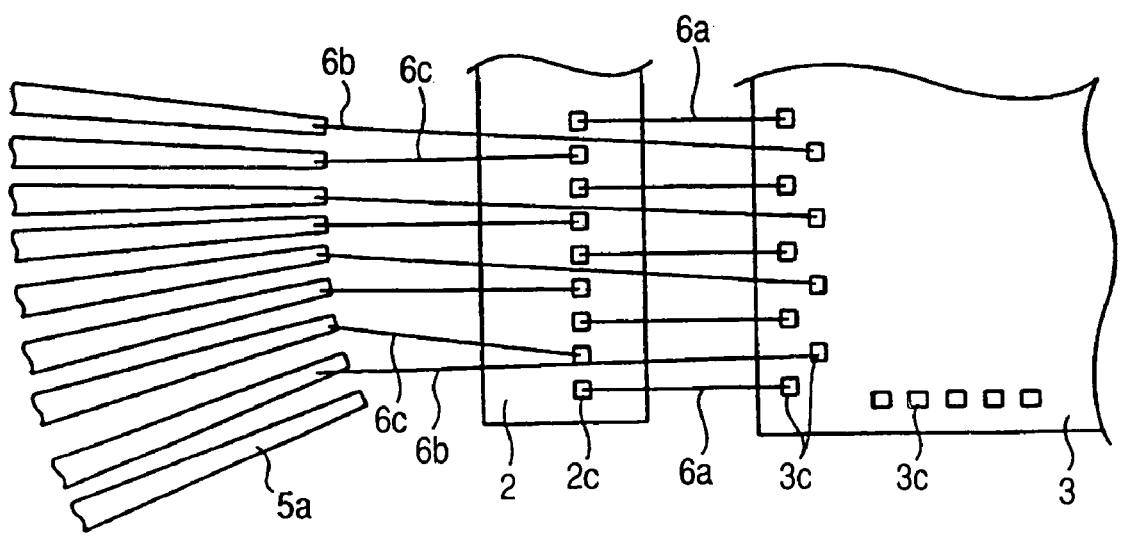
FIG. 11 is an enlarged partial plane view showing an example of a structure after connecting a first chip and a lead in wire bonding shown in FIG. 6.
Figure 12:
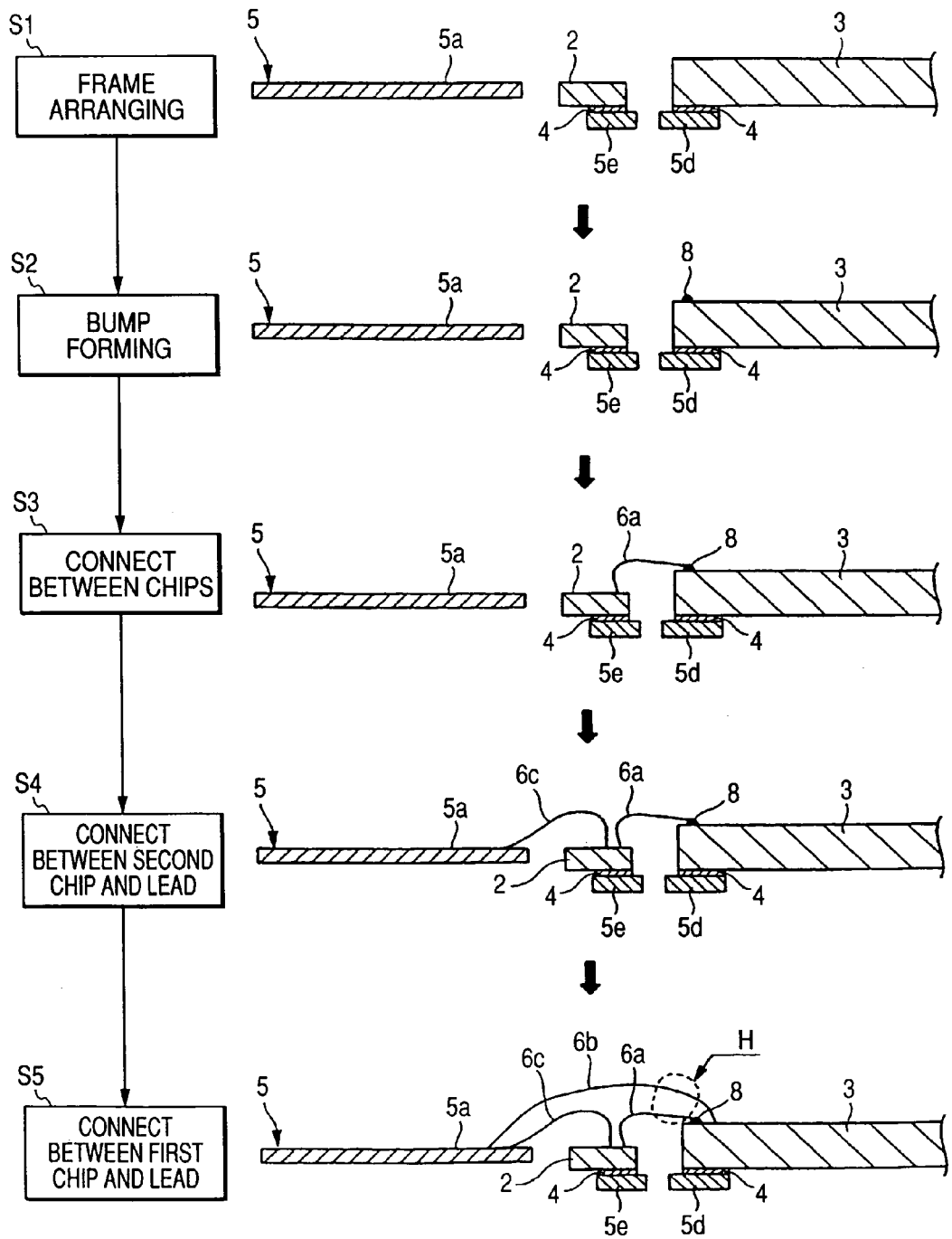
FIG. 12 illustrates a flowchart and a sectional view showing an example of an order of bonding in wire bonding shown in FIG. 6.
Figure 13:
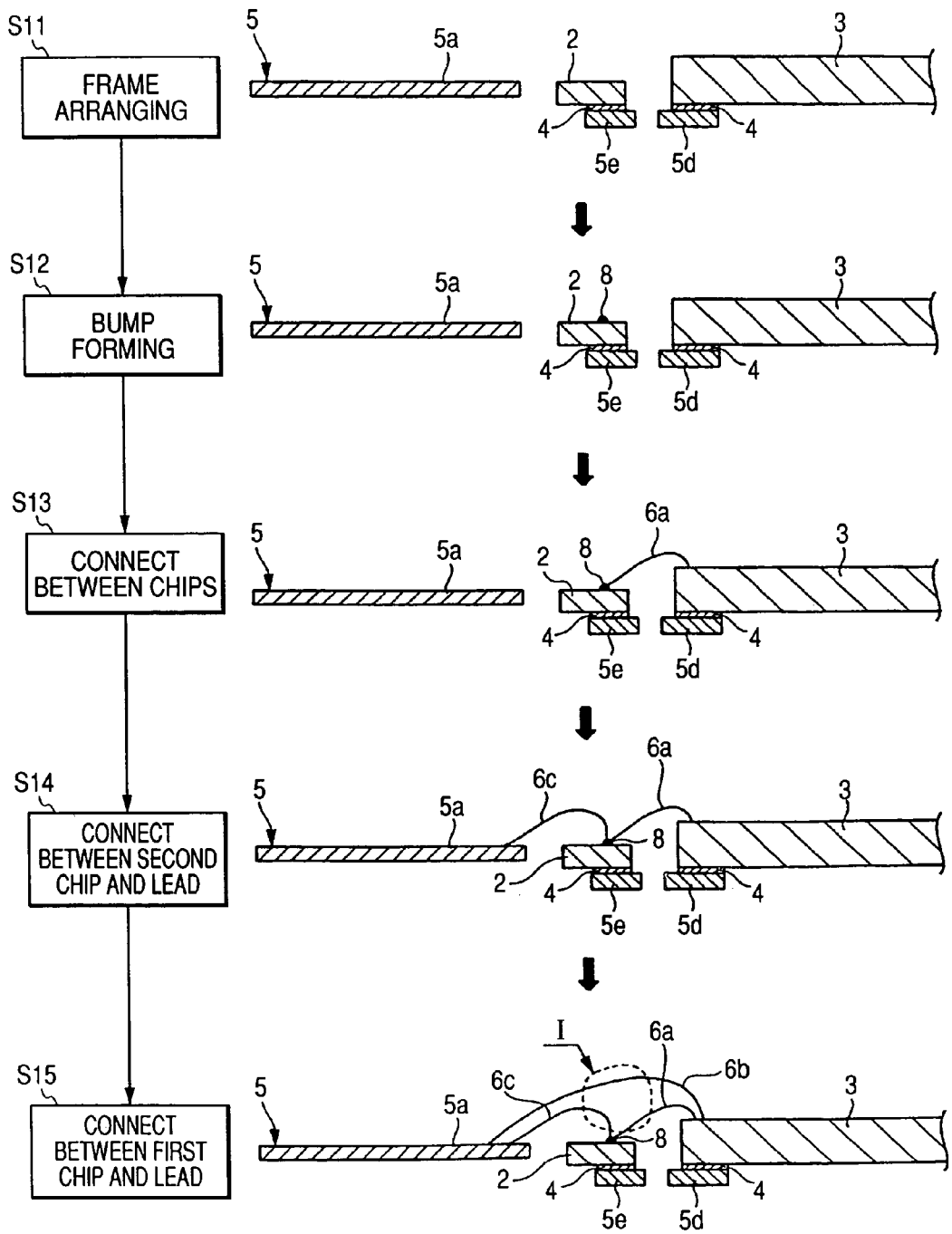
FIG. 13 illustrates a flowchart and a sectional view showing an order of bonding of a modified example in wire bonding shown in FIG. 6.
Figure 14:
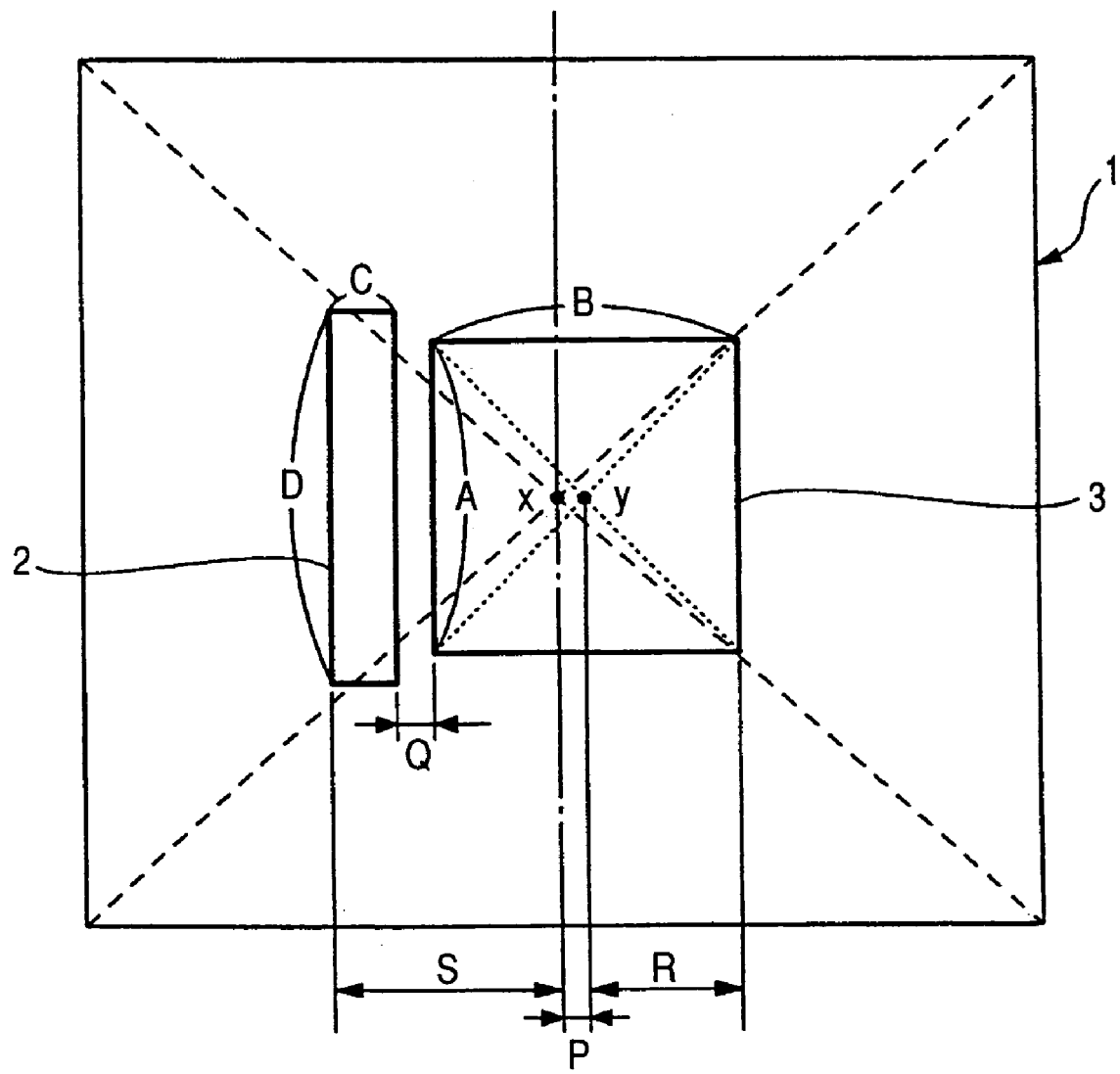
FIG. 14 is a plane view showing an example of a layout of arranging a chip in the semiconductor integrated circuit shown in FIG. 1.
Figure 15:
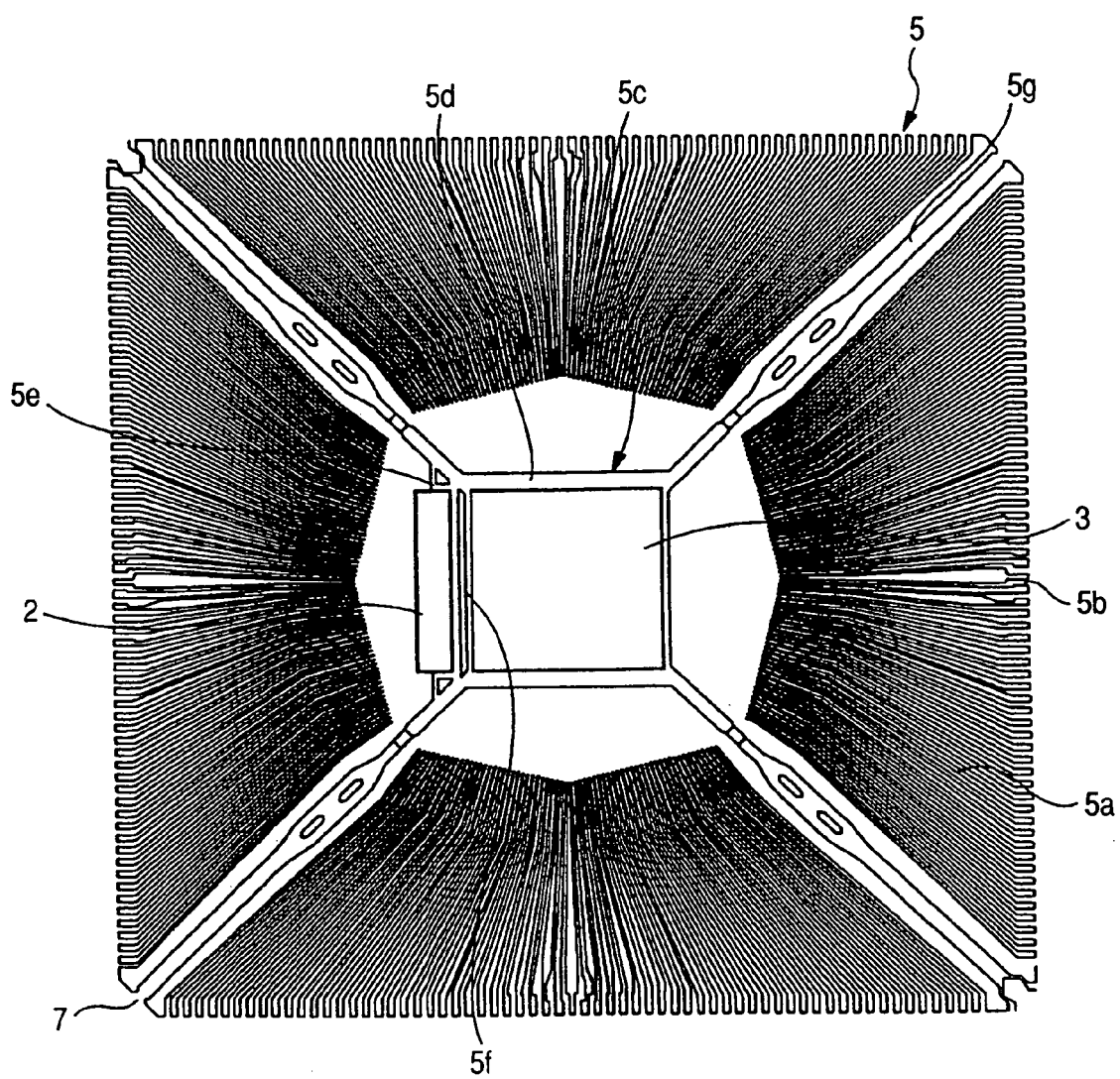
FIG. 15 is a plane view showing a structure of a modified example of a lead frame used in integrating the semiconductor integrated circuit of Embodiment 1 according to the invention.
Figure 16:
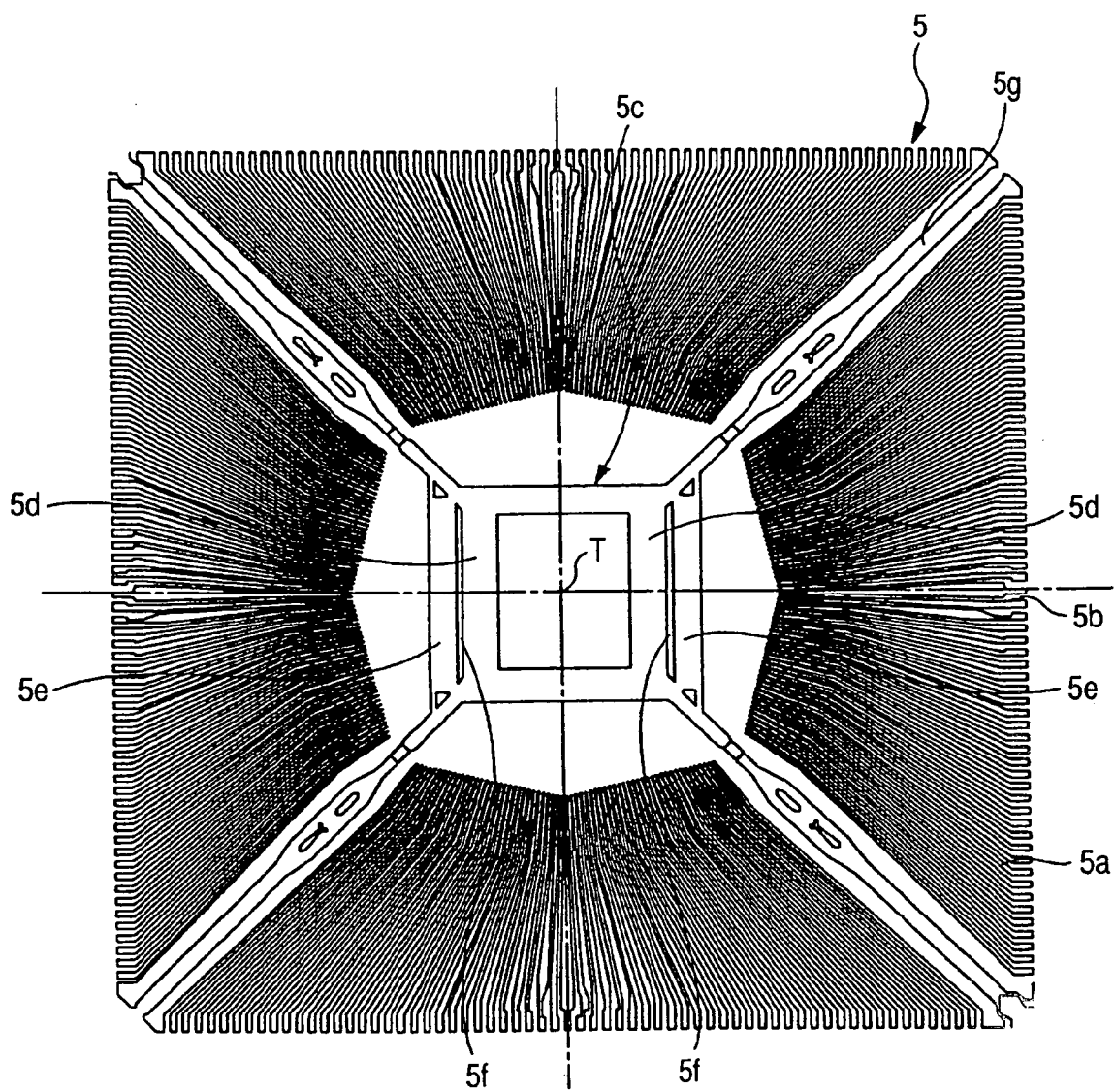
FIG. 16 is a plane view showing a structure of a modified example of a lead frame used in integrating the semiconductor integrated circuit of Embodiment 1 according to the invention.
Figure 17:
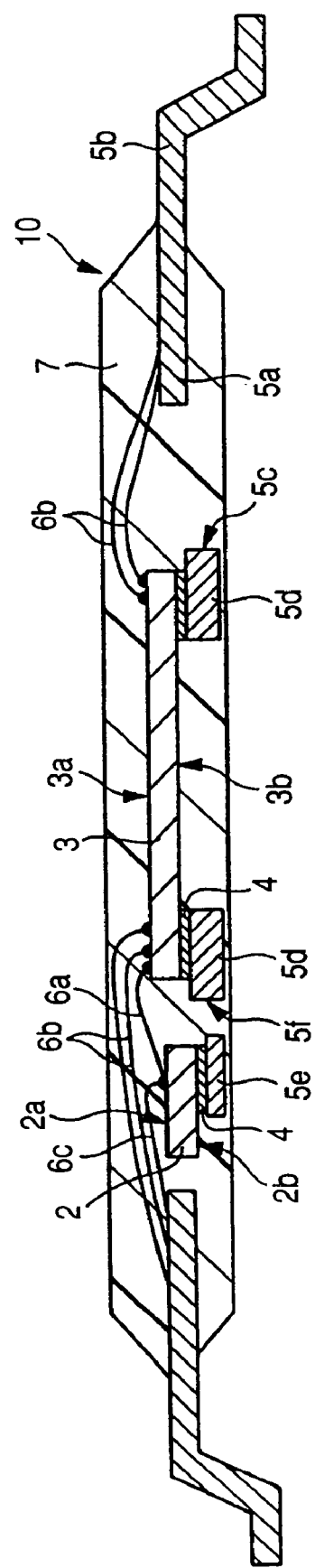
FIG. 17 is a sectional view showing a structure of a semiconductor integrated circuit of a modified example of Embodiment 1 according to the invention.
Figure 18:
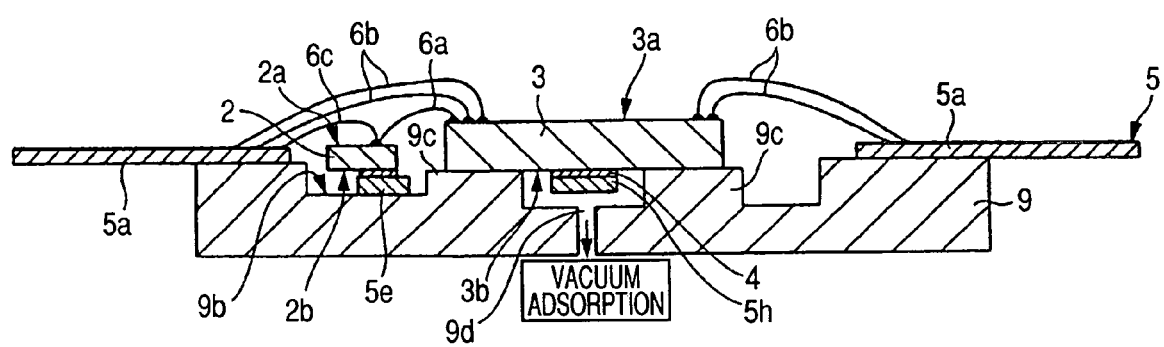
FIG. 18 is a sectional view showing a structure in wire bonding in integrating a semiconductor integrated circuit of a modified example of Embodiment 1 according to the invention.

FIG. 1 is a partial plane view showing an example of a structure of a semiconductor integrated circuit according to Embodiment 1 of the invention by seeing through a seal member, FIG. 2 is a sectional view showing the example of the structure of the semiconductor integrated circuit shown in FIG. 1, FIG. 3 is a block diagram showing an example of a system of the semiconductor integrated circuit shown in FIG. 1, FIG. 4 is a sectional view showing an example of a structure of a lead frame used in integrating the semiconductor integrated circuit shown in FIG. 1, FIG. 5 is a sectional view showing an example of a structure in finishing die bonding, FIG. 6 is a sectional view showing an example of a structure in finishing wire bonding, FIG. 7 is a sectional view showing an example of a structure in finishing to seal by a resin, FIG. 8 is an enlarged partial plane view showing an example of a structure before bonding in wire bonding, FIG. 9 is an enlarged partial plane view showing an example of a structure after connecting chips in wire bonding, FIG. 10 is an enlarged partial plane view showing an example of a structure after connecting a second chip and a lead in wire bonding, FIG. 11 is an enlarged partial plane view showing an example of a structure after connecting a first chip and a lead in wire bonding, FIG. 12 illustrates a flowchart and a sectional view showing an example of an order of bonding in wire bonding, FIG. 13 illustrates a flowchart and a sectional view showing an order of bonding of a modified example in wire bonding, FIG. 14 is a plane view showing an example of a layout of arranging a chip in the semiconductor integrated circuit shown in FIG. 1, FIG. 15 and FIG. 16 are plane views showing structures of modified examples of lead frames respectively used in integrating the semiconductor integrated circuit of Embodiment 1, FIG. 17 is a sectional view showing a structure of a semiconductor integrated circuit of a modified example of Embodiment 1 of the invention, and FIG. 18 is a sectional view showing a structure in wire bonding in integrating a semiconductor integrated circuit of a modified example of Embodiment 1 according to the invention.

A semiconductor integrated circuit of Embodiment 1 shown in FIG. 1 and FIG. 2 is a multichip package having a plurality of semiconductor chips and an explanation will be given here by taking an example of SIP 1 integrated with a semiconductor chip having a memory circuit and a semiconductor chip for controlling the above-described semiconductor chip and having a processing function.

Further, SIP 1 of Embodiment 1 is a resin seal type semiconductor package of a frame type integrated by using a lead frame 5 shown in FIG. 4 and an explanation will be given of SIP 1 when SIP 1 is integrated with two semiconductor chips of a microcomputer chip 3 which is a first semiconductor chip (also referred to as first semiconductor chip or system chip or ASIC) having a processing function, and SDRAM (Synchronous Dynamic Random Access Memory) 2 which is a second semiconductor chip having a memory circuit (also referred to as second semiconductor chip).

Explaining a constitution of SIP 1 shown in FIG. 1 and FIG. 2, SIP 1 comprises the microcomputer chip 3 which is the first semiconductor chip having a semiconductor element and a plurality of pads (electrodes) 3c at a semiconductor chip surface 3a thereof, SDRAM 2 (memory chip) which is the second semiconductor chip having a semiconductor element and a plurality of pads (electrodes) 2c at a semiconductor chip surface 2a thereof, arranged to align at a side of the microcomputer chip 3 and having a thickness thinner than that of the microcomputer chip 3, a tab 5c which is a chip mounting portion having a first chip mounting portion 5d and a second chip mounting portion 5e, an inner lead 5a constituting a plurality of leads arranged at surroundings of the microcomputer chip 3 and SDRAM 2, a plurality of outer leads 5b which are external terminals integrally connected to respectives of the inner leads 5a and exposed outside, a plurality of conductive first bonding wires 6a for respectively electrically connecting the pads 3c of the microcomputer chip 3 and the pads 2c of SDRAM 2 in correspondence therewith, a plurality of conductive second bonding wires 6b for respectively electrically connecting the pads 3c of the microcomputer chip 3 and the inner leads 5a in correspondence therewith, arranged to ride over SDRAM 2 and formed with a loop at a position higher than a loop of the first bonding wire 6a, and a seal member 7 for sealing the microcomputer chip 3, SDRAM 2, the pluralities of the first bonding wires 6a and the second bonding wires 6b by a resin.

Further, the respective outer leads 5b formed by being integrally connected to the respective inner leads 5a are projected to outside from respectives of four corners of the seal member 7 and as shown by FIG. 2, the respective outer leads 5b are formed to bend in a shape of a gull wing.

Therefore, an outlook shape of SIP 1 of Embodiment 1 is the same as that of QFP (Quad Flat Package) and as shown by FIG. 1, SIP 1 is provided with a number of pins of 200 pieces or more.

Further, the tab 5c constituting the chip mounting portion comprises the first chip mounting portion 5d connected to the microcomputer chip 3 and the second chip mounting portion 5e connected to SDRAM 2, the first chip mounting portion 5d and the second chip mounting portion 5e are integrally formed to constitute the tab 5c, and the first chip mounting portion 5d and the second chip mounting portion 5e include chip supporting faces of the same plane. Further, the tab 5c is connected to hang leads 5g respectively at four corners thereof.

Further, the first chip mounting portion 5d is formed in a frame-like shape, the plurality of pads 3c are arranged at the microcomputer chip 3 along peripheral edge portions of four sides of the semiconductor chip surface 3a and therefore, the first chip mounting portion 5d in the frame-like is arranged in a mode in correspondence with arrays of the pads 3c at the four sides at lower portions thereof.

Meanwhile, the second chip mounting portion 5e is formed in a rectangular shape, and the second chip mounting portion 5e is arranged in a mode in correspondence with arrays of the plurality of pads 2c formed at the semiconductor chip surface 2a of SDRAM 2 at lower portions thereof.

Further, as shown by FIG. 3, the microcomputer chip 3 of SIP 1 is integrated with respective circuits of CPU (Central Processing Unit) 3d, a logic circuit 3e, an analog circuit 3f, and an inner memory 3g, interface circuits of input/output circuit 3i for memory connection and an input/output circuit 3j for external connection, and the input/output circuit 3i for memory connection is connected to DRAM 2 via the respective first bonding wires 6a. Further, input/output circuit 3j for external connection are connected to the inner leads 5a via the respective second wires 6b and the inner leads 5a are connected to the outer leads 5b.

SIP 1 of Embodiment 1 is laterally aligned to arrange with the microcomputer chip 3 and SDRAM 2, in this case, an array of the pads 2c of SDRAM 2 and an array of the pads 3c of the microcomputer chip 3 in correspondence therewith are arranged to align contiguously, thereby, the pads 3c of the microcomputer chip 3 and the pads 2c of SDRAM 2 contiguous thereto are connected by the first bonding wires 6a.

Under the state, signals of address, data, command and clock are transmitted between the two chips via the respective first bonding wires 6a, however, the main pads 2c (excluding those for power source and GND) of SDRAM 2 and the first bonding wires 6a are not electrically connected to the outer leads 5b. That is, there is constituted a structure in which a bus for memory connected to SDRAM 2 is closed at inside of the package and is not extruded to outside as a wire or a terminal.

However, the pads 2c for power source or GND of SDRAM 2 are connected to the inner leads 5a via third bonding wires 6c, further, the outer leads 5b integrally connected with inner leads 5a constitute external terminals, and a power source potential and a GND potential are applied to SDRAM 2 from outside via the third bonding wires 6c.

Further, the logic circuit 3c of the microcomputer chip 3 is provided with a BIST (Built In Self Test) circuit (test circuit) 3h capable of tensing a memory circuit provided outside of the microcomputer chip 3. That is, the logic circuit 3e of the microcomputer chip 3 is provided with the BIST circuit 3h capable of testing a memory circuit of SDRAM 2, and the BIST circuit 3h of the microcomputer chip 3 and the pad 2c of SDRAM 2 in correspondence therewith are electrically connected by the first bonding wire 6a.

Thereby, SDRAM 2 can be tested by a control from the microcomputer chip 3.

In this way, according to SIP 1 of Embodiment 1, the microcomputer chip 3 and SDRAM 2 are arranged to align laterally such that the plurality of pads 2c connecting to the input/output circuit 3i for memory connection constituting an interface circuit of a bus for memory of SDRAM 2 and the pads 3c of the microcomputer chip 3 in correspondence therewith are arranged contiguously to each other, thereby, the pads 3c of the microcomputer chip 3 and the pads 2c of SDRAM 2 are connected by the first bonding wires 6a, further, other pads 3c of the microcomputer chip 3 arranged contiguous to SDRAM 2 are connected by the second bonding wires 6b by arranging the second bonding wires 6b to ride over SDRAM 2, and the input/output circuit 3i for memory connection of SDRAM 2 is closed in the package by constituting only connection between chips by the first bonding wires 6a without connecting to an external terminal. That is, the input/output circuit 3i for memory connection constituting the interface circuit of the bus for memory is not connected to an external terminal and therefore, pins therefor can be utilized for other function, and even when a number of external terminals is limited by being restricted by a size of the semiconductor integrated circuit, further multifunction formation can be achieved. Further, SIP 1 is of a frame type integrated by using the lead frame 5 and by adopting a frame type, a reduction in cost of SIP 1 can be achieved.

Further, when an object is not constituted by multifunction formation, the input/output circuit 3i for memory connection of SDRAM 2 is not connected to an external terminal and therefore, SIP 1 can be downsized by reducing a number of pins (number of external terminals) therefor.

Further, by arranging the second bonding wires 6b by riding over SDRAM 2, the pads 3c of the microcomputer chip 3 and the inner leads 5a can be connected by the second bonding wires 6b and therefore, outer leads 5b connected to the inner leads 5a can effectively be utilized.

As a result, function of SIP 1 can be promoted.

Further, as shown by FIG. 2, the thickness of SDRAM 2 is thinner than that of the microcomputer chip 3 and therefore, a height of the pad 2c of SDRAM 2 becomes lower than a height of the pad 3c of the microcomputer chip 3, and a difference is produced between positions of the heights of the two pads. Thereby, when the second bonding wire 6b for connecting the microcomputer chip 3 and the inner lead 5a rides over SDRAM 2, the loop of the second bonding wire 6b can be formed at a position sufficiently higher than that of the loop of the first bonding wire 6a.

Therefore, as indicated by a portion G of FIG. 2, intervals among wires of respectives of the second boding wire 6b and the first bonding wire 6a, as well as the second bonding wire 6b and the third bonding wire 6c can be formed to be large at a vicinity above SDRAM 2, and interference of the wires at the vicinity above SDRAM 2 can be prevented.

Further, in SIP 1, a rear face 3b of the microcomputer chip 3 is connected to the first chip mounting portion 5d in the frame-like shape via a die bond member of a silver paste 4 or the like. Therefore, as shown by FIG. 2, at an opening portion (F portion) of a center portion of the first chip mounting portion 5d in the frame-like shape, the rear face 3b of the microcomputer chip 3 is brought into close contact with a portion of the seal member 7.

Meanwhile, a rear face 2b of SDRAM 2 is similarly connected to the second chip mounting portion 5e via the die bond member of the silver paste 4 or the like, and connected thereto in a state in which SDRAM 2 is overhung from the second chip mounting portion 5e in a slender rectangular shape or a polygonal shape. Therefore, at a portion (portion E) at which SDRAM 2 is overhung from the second chip mounting portion 5e, the rear face 2b of SDRAM 2 is brought into close contact with a portion of the seal member 7.

By bringing portions of the respective rear faces 3b, 2b of the microcomputer chip 3 and SDRAM 2 into close contact with portions of the seal member 7 in this way, in the respective semiconductor chips, areas of being brought into close contact with the seal member 7 along with sides of the semiconductor chip surfaces 3a, 2a can be increased, as a result, a reflow crack resistance can be promoted.

Further, in SIP 1, the respective inner leads 5a, the respective outer leads 5b, the first chip mounting portion 5d, the second chip mounting portion 5e and the hang lead 5g are formed by thin plate members comprising, for example, a copper alloy.

Further, SDRAM 2 and the microcomputer chip 3 are formed by, for example, silicon, further, the first bonding wire 6a, the second bonding wire 6b and the third bonding wire 6c are, for example, gold wires.

Further, the seal member 7 is formed by, for example, thermosetting epoxy resin.

Next, a method of fabricating SIP 1 of Embodiment 1 will be explained.

First, the lead frame 5 shown in FIG. 4 is prepared. That is, the lead frame 5 including a tab (chip mounting portion) 5c comprising the first chip mounting portion 5d and the second chip mounting portion 5e arranged to be aligned therewith, and the pluralities of inner leads 5a and the outer leads 5b arranged at a surrounding of the tab 5c is prepared.

Further, the lead frame 5 is a frame member in a plate-like shape comprising a copper alloy or the like. Further, the tab 5c is integrally formed with the first chip mounting portion 5d in the frame-like shape and the slender second chip mounting portion 5e in the rectangular shape, and the first chip mounting portion 5d and the second chip mounting portion 5e include chip supporting faces on the same plane.

Thereafter, die bonding shown in FIG. 5 is carried out. Here, the microcomputer chip 3 is mounted on the first chip mounting portion 5d via the silver paste 4 such that the plurality of pads 3c of the microcomputer chip 3 are arranged above the first chip mounting portion 5d. Further, SDRAM 2 is mounted on the second chip mounting portion 5e via the silver paste 4 such that the plurality of pads 2c of SDRAM 2 are arranged above the second chip mounting portion 5e.

Further, with regard to an order of die bonding of the microcomputer chip 3 and SDRAM 2, either thereof may be the first.

Thereby, there is brought about a state in which the first chip mounting portion 5d is arranged at lower portions of the respective pads 3c of the microcomputer chip 3 and the second chip mounting portion 5e is arranged at lower portions of the respective pads 2c of SDRAM 2.

Thereafter, wire bonding is carried out by a gold wire or the like as shown by FIG. 6. At that occasion, as shown by FIG. 8 through FIG. 11, first, the chips are connected by the first bonding wire 6a, successively, SDRAM 2 and the inner lead 5a are connected by the third bonding wire 6c, thereafter, the microcomputer chip 3 and the inner lead 5a are connected by the second bonding wire 6b. That is, in a state of arranging the microcomputer chip 3 and SDRAM 2 and the inner lead 5a as shown by FIG. 8, the pads 3c of the microcomputer chip 3 and the pads 2c of SDRAM 2 in correspondence therewith are subjected to the wire bonding respectively by the first bonding wires 6a as shown by FIG. 9. Successively, as shown by FIG. 10, the pads 2c of SDRAM 2 and the inner leads 5a in correspondence therewith are subjected to wire bonding by the third bonding wires 6c. Further, the pads 2c connected to the inner leads 5a via the third bonding wires 6c in SDRAM 2 are electrodes applied with a power source potential or a GND potential. Thereafter, as shown by FIG. 11, the pads 3c of the microcomputer chip 3 and the inner leads 5a in correspondence therewith are subjected to wire bonding by making the second bonding wires 6b ride over SDRAM 2.

Here, FIG. 12 and FIG. 13 respectively show an order of bonding of 1st side and 2nd side on bonding the first bonding wire 6a between chips, FIG. 12 shows a case in which 1st side is constituted by SDRAM 2 and 2nd side is constituted by the microcomputer chip 3 in wire bonding between the chips, and FIG. 13 shows a case of constituting 1st side by the microcomputer chip 3 and constituting 2nd side by SDRAM 2.

That is, according to the bonding method shown in FIG. 12, at step S1, a frame is arranged and at step S2, a bump is formed. Here, a gold bump 8 is formed on the microcomputer chip 3. The gold bump 8 is formed on the microcomputer chip 3 by a stud bump forming technology utilizing a wire bonding technology.

Thereafter, the chips are connected as shown in step S3. Here, wire bonding is carried out by constituting 1st side of wire bonding by SDRAM 2 and constituting 2nd side by the microcomputer chip 3. That is, first, the first bonding wire 6a and SDRAM 2 are connected, thereafter, the first bonding wire 6a and of the microcomputer chip 3 are connected. Further, since the gold bump 8 is formed on the microcomputer chip 3 on 2nd side, even in connecting the first bonding wire 6a and the microcomputer chip 3 on 2nd side, the connection can be carried out via the gold bump 8. By previously forming the gold bump 8 on the pad 3c subjected to wire bonding on 2nd side, destruction of the microcomputer chip 3 can be prevented and the connection can be carried out by promoting connection performance in a wire bonding step.

Thereafter, as shown by step S4, the second chip and the lead are connected. That is, SDRAM 2 and the inner lead 5a are connected by the third bonding wire 6c. Successively, the first chip and the lead are connected as shown by step S5. That is, the microcomputer chip 3 and the inner lead 5a are connected by the second bonding wire 6b.

By constituting 1st side by SDRAM 2 (thin semiconductor chip) and constituting 2nd side by the microcomputer chip 3 (thick semiconductor chip) by connecting the chips, as shown by a portion H of step S5 of FIG. 12, the interval between the first bonding wire 6a and the second bonding wire 6b at a vicinity above the microcomputer chip 3 can be formed to be large and interference of bonding wires at the vicinity above the microcomputer chip 3 can be prevented.

Next, according to a bonding method of a modified example shown in FIG. 13, the frame is arranged at step S11, and the bump is formed at step S12. Here, the gold bump 8 is formed on SDRAM 2.

Thereafter, the chips are connected as shown by step S13. Here, wire bonding is carried out by constituting 1st side of wire bonding by the microcomputer chip 3 and constituting 2nd side by SDRAM 2. That is, first, the first bonding wire 6a and the microcomputer chip 3 are connected, thereafter, the first bonding wire 6a and SDRAM 2 are connected. Further, since the gold bump 8 is formed on SDRAM 2 on 2nd side, in connecting the first bonding wire 6a and SDRAM 2 on 2nd side, the connection can be carried out via the gold bump 8 and connection can be carried out by promoting connection performance thereof.

Thereafter, the second chip and the lead are connected as shown by step S14. That is, SDRAM 2 and the inner lead 5a are connected by the third bonding wire 6c. Successively, the first chip and the lead are connected as shown by step S15. That is, the microcomputer chip 3 and the inner lead 5a are connected by the second bonding wire 6b.

By constituting 1st side by the microcomputer chip 3 (thick semiconductor chip) and constituting 2nd side by SDRAM 2 (thin semiconductor chip) in connecting the chips, as shown by a portion I of step S15 of FIG. 13, an interval between the first bonding wire 6a and the second bonding wire 6b at a vicinity above SDRAM 2 can be formed to be larger and interference of wires at the vicinity above the microcomputer chip 3 can further be prevented.

Further, as a timing of forming the gold bump 8 on the semiconductor chip on 2nd side in connecting the chip by the first bonding wire 6a, the gold bump 8 may be formed at an electrode of a predetermined semiconductor chip before proceeding to a wire bonding step, for example, in a wafer state of a preceding step or the like.

Further, as shown by FIG. 6, in wire bonding of Embodiment 1, both of the microcomputer chip 3 and SDRAM 2 are arranged with the first chip mounting portion 5d and the second chip mounting portion 5e respectively below the pads 3c, 2c and therefore, wire bonding can be carried out in a state of supporting the first chip mounting portion 5d and the second chip mounting portion 5e by a same flat surface 9a of a heat stage 9 which is a heating device. That is, faces of the heat stage 9 for supporting the microcomputer chip 3 and SDRAM 2 can be constituted by the flat surface 9a by the same plane, in a state of supporting lower portions of the respective pads 3c, 2c by the same flat surface 9a of the heat stage 9, the pads 3c of the microcomputer chip 3 and the pads 2c of SDRAM 2 are bonded by the first bonding wires 6a, the pads 2c of SDRAM 2 and the inner leads 5a are bonded by the third bonding wires 6c, and the pads 3c of the microcomputer chip 3 and the inner leads 5a are connected by the second bonding wires 6b, respectively.

By constituting the face of supporting the semiconductor chip of the heat stage 9 by the flat face 9a by the same plane, the heat stage 9 can inexpensively be formed by constituting the shape by an easy shape, and a bonding load can firmly be supported by the flat surface 9a of the heat stage 9 at the lower portions of the respective pads 3c, 2c. Further, heating of the pads 3c, 2c by the heat stage 9 can firmly be carried out. Therefore, bonding performance can be promoted.

After wire bonding, sealing by a resin shown in FIG. 7 is carried out. Here, the seal member 7 is formed by sealing the microcomputer chip 3, SDRAM 2 and the tab 5c, further, the pluralities of first bonding wires 6a, second bonding wires 6b, third bonding wires 6c and the inner leads 5a by a resin molding.

Thereafter, by cutting to separate the plurality of outer leads 5b from the lead frame 5 to form fragmented pieces and bending the respective outer leads 5b in a shape of a gull wing, SIP 1 is finished to integrate.

Next, FIG. 14 shows a condition of a layout of arranging two semiconductor chips when the microcomputer chip 3 and SDRAM 2 are arranged in the lateral direction. Here, when a length of a long side of the microcomputer chip 3 is designated by notation A, a length of a short side thereof is designated by notation B, a center in plane direction is designated by notation y, meanwhile, a length of a long side of SDRAM 2 is designated by notation D, a length of a short side thereof is designated by notation C, and a center in plane direction of SIP 1 is designated by notation x, further, an absolute value of (x−y) is designated by notation P (notation P designates a distance between x and y in a direction in parallel with a direction of the short side of SDRAM 2), and an interval between the microcomputer chip 3 and SDRAM 2 is designated by notation Q, it is preferable that P<(C/2).

This is because when the microcomputer chip 3 and SDRAM 2 are conceived as a single silicon rigid body, and a center of the rigid body is arranged to align with the center x of SIP 1, ½ of (C+Q+B) becomes a length S. That is, S=(C+Q+B)×(½). Further, an amount (x−y) of shifting the center y of the microcomputer chip 3 and the center of x of SIP 1 is (x−y)=P, and P=S−R. Since R=B/2, when P is calculated, P=((C+Q+B)/2)−B/2 and therefore, P=(C+Q)/2.

Hence, when the amount P of shifting the center y of the microcomputer chip 3 and the center x of SIP 1 becomes much smaller than (C+Q)/2 and smaller than (C/2), the center y of the microcomputer chip 3 is brought into a state of being much proximate to the center x of SIP 1 and therefore, by constituting P<(C/2), the center y of the microcomputer chip 3 can be made to be further proximate to the center x of SIP 1, as a result, lengths of the pluralities of second bonding wires 6b for bonding to a surrounding of four sides of the microcomputer chip 3 can be made to be substantially equal to each other. Thereby, a balance of flow of a resin in the resin molding can be improved.

That is, respective pluralities of the second bonding wires 6b are arranged in four directions in correspondence with four sides of the seal member 7 of SIP 1 and therefore, the length of the second bonding wires 6b can be made to be substantially equal to each other, as a result, the balance of flow of the resin in resin molding can be improved.

Further, as shown by FIG. 14, by arranging the long side of the microcomputer chip 3 and the long side of SDRAM 2 to be opposed to each other, when the microcomputer chip 3 and SDRAM 2 are conceived as the single rigid body, the rigid body is arranged to SIP 1 with excellent balance and therefore, balance of inner stress is improved and warp of SIP 1 or the like can be reduced.

Further, in SIP, although a planar shape of SDRAM 2 is rectangular, the shape of the microcomputer chip 3 may not be rectangular but may be, for example, square.

Next, an explanation will be given of the lead frame 5 of modified examples respectively shown in FIG. 15 and FIG. 16.

The lead frame 5 shown in FIG. 15 is formed with a slit 5f in the tab 5c at a region between the first chip mounting portion 5d and the second chip mounting portion 5e. The slit 5f is formed slenderly along the long side of the second chip mounting portion 5e in the region between the first chip mounting portion 5d and the second chip mounting portion 5e.

Therefore, in finishing to integrate SIP 1, as shown by FIG. 2, there is constructed a structure of bringing sealing resin into the slit 5f and embedding a portion of the seal member 7 into the slit 5f.

Since the sealing resin (for example, thermosetting resin of epoxy species) is provided with a poor heat conductivity and therefore, by arranging a portion of the seal member 7 (resin in the slit 5f) between the chips, conduction of heat generated from the microcomputer chip 3 can be prevented from being conducted to SDRAM 2 by blocking heat by the seal member 7 arranged between the chips by the portion.

That is, according to the microcomputer chip 3 having CPU 3d frequently executing signal processings and SDRAM 2 having the memory circuit, power consumption of the microcomputer chip 3 is far larger and a heat generating amount is larger and therefore, the characteristic of SIP 1 can be prevented from being deteriorated by blocking heat generated by the microcomputer chip 3 by the resin in the slit 5f such that the heat is not conducted to SDRAM 2.

Further, according to the lead frame 5 shown in FIG. 16, a pattern shape of the tab 5c constituted by integrally forming the first chip mounting portion 5d and the second chip mounting portion 5e is formed in point symmetry (180° rotational symmetry) relative to the center in the plane direction of a main body (seal member 7) of SIP 1 (center T of a device region in correspondence with single SIP 1 in the lead frame 5).

In this way, in working a frame by punching, working accuracy can be promoted for a constitution in the pattern shape in point symmetry relative to the center and the frame is made to be easy to fabricate by promoting workability of the lead frame 5. Further, a stress generated at the lead frame 5 in integrating SIP 1 can be applied substantially uniformly with excellent balance over a total of the main body of SIP 1.

Further, the balance of flow of the sealing resin in resin molding can be improved and warp of the seal member 7 brought about in thermosetting the sealing resin can be reduced.

Next, an explanation will be given of SIP 10 of a modified example shown in FIG. 17.

Although SIP 10 shown in FIG. 17 is constituted by a structure similar to that of SIP 1 shown in FIG. 2, as a difference from SIP 1, the thickness of the microcomputer chip 3 the thickness of which has been thicker than that of SDRAM 2 in SIP 1 is made to be the same as that of SDRAM 2, and a thickness of the second chip mounting portion 5e of the tab 5c is formed to be thinner than that of the first chip mounting portion 5d.

That is, although SIP 10 is constructed by a structure similar to that of SIP 1, in order to achieve thin-sized formation, the thickness of the microcomputer chip 3 is made to be thinner than that of SIP 1 to be a thickness substantially the same as that of SDRAM 2. At that occasion, above SDRAM 2, similar to SIP 1, the first bonding wires 6a for connecting the chip, the third bonding wires 6c for connecting SDRAM 2 and the leads, and the second bonding wires 6b for forming the loops higher than those of the first bonding wires 6a and the third bonding wires 6c by riding over SDRAM 2 are arranged and therefore, it is necessary to constitute a difference between the height positions of the pads 3c, 2c between the two chips similar to SIP 1 and therefore, by forming the thickness of the second chip mounting portion 5e to be thinner than that of the first chip mounting portion 5d, the difference is provided between the positions in the height direction of the pads 3c, 2c between the two chips.

For example, the thickness of the second chip mounting portion 5e of the tab 5c is formed to be as thin as about a half of the thickness of first chip mounting portion 5d by half etching or stamping. Thereby, since the thicknesses of the microcomputer chip 3 and SDRAM 2 are the same, according to the positions in the height direction of the pads 3c, 2c between the two chips, similar to SIP 1, the pads 2c of SDRAM 2 are disposed at the positions lower than the heights of the pads 3*c* of the microcomputer chip 3. That is, the difference can be provided to the positions of the heights between the two pads.

Thereby, similar to SIP 1, the second bonding wires 6*b* for connecting the microcomputer chip 3 and the inner lead 5*a* can be made to ride over SDRAM 2 and the loops of the second wires 6*b* can be formed at the positions higher than those of the loop of the first bonding wire 6*a*. As a result, interference of wires can be prevented by increasing the intervals between respective wires of the second bonding wires 6*b* and the first bonding wires 6*a* as well as the second wires 6*b* and the third bonding wires 6*c* at the vicinity above SDRAM 2, the thickness of the microcomputer chip 3 is made to be thinned to a degree the same as that of SDRAM 2 in comparison with SIP 1, thin-sized formation of SIP 10 can be achieved.

Next, a modified example shown in FIG. 18 will be explained. FIG. 18 shows a mode of supporting the lead frame 5 by the heat stage 9 in wire bonding in integrating operation thereof in an SIP product having a structure supporting the rear face 3*b* of the microcomputer chip 3 with a small tab 5*h* having a smaller area than that of the rear face 3*b*.

That is, there is shown a mode of supporting by the heat stage (heating device) 9 in wire bonding in the case of the SIP product having a small tab structure, by vacuuming to adsorb the rear face 3*b* of the microcomputer chip 3 supported by the small tab 5*h* by vacuuming from an exhaust port 9*d* of the heat stage 9, in a state in which the low portions of the plurality of the pads 3*c* of the microcomputer chip 3 are supported by a projected portion 9*c* of the heat stage 9 and the second chip mounting portion 5*e* of the lead frame 5 is supported by a recess portion 9*b* of the heat stage 9, the plurality of pads 3*c* of the microcomputer chip 3 and the plurality of pads 2*c* of SDRAM 2 are electrically connected respectively by the plurality of conductive first bonding wires 6*a*, further, the pads 2*c* of SDRAM 2 and the inner leads 5*a* in correspondence therewith are electrically connected by the third bonding wires 6*c*, further, the plurality of pads 3*c* of the microcomputer chip 3 and the plurality of inner leads 5*a* are electrically connected respectively by the plurality of conductive second bonding wires 6*b*.

In this way, in the case of the SIP product having the small tab structure, the lower portions of the pads 3*c* of the microcomputer chip 3 may not necessarily be supported by the first chip mounting portion 5*d*, and in wire bonding, by supporting portions of the rear face 3*b* in correspondence with the pad 3*d* directly by a portion (projected portion 9*c*) of the lead stage 9, even in the SIP product having the small tab structure, wire bonding can be executed similar to SIP 1 and SIP 10.

(Embodiment 2)

Figure 19:
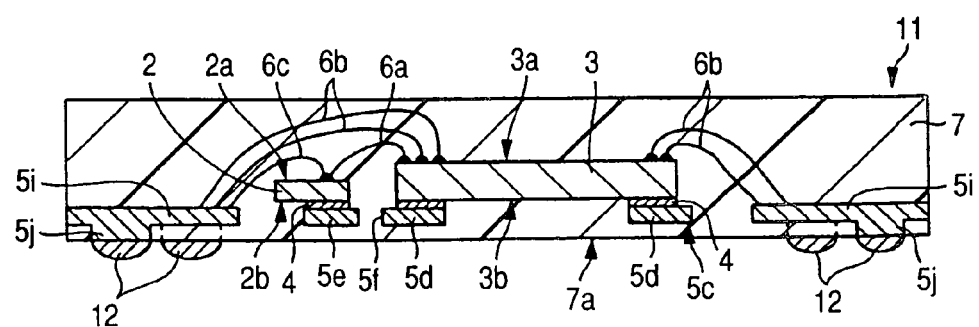
FIG. 19 is a sectional view showing an example of a structure of a semiconductor integrated circuit of Embodiment 2 according to the invention.
Figure 20:
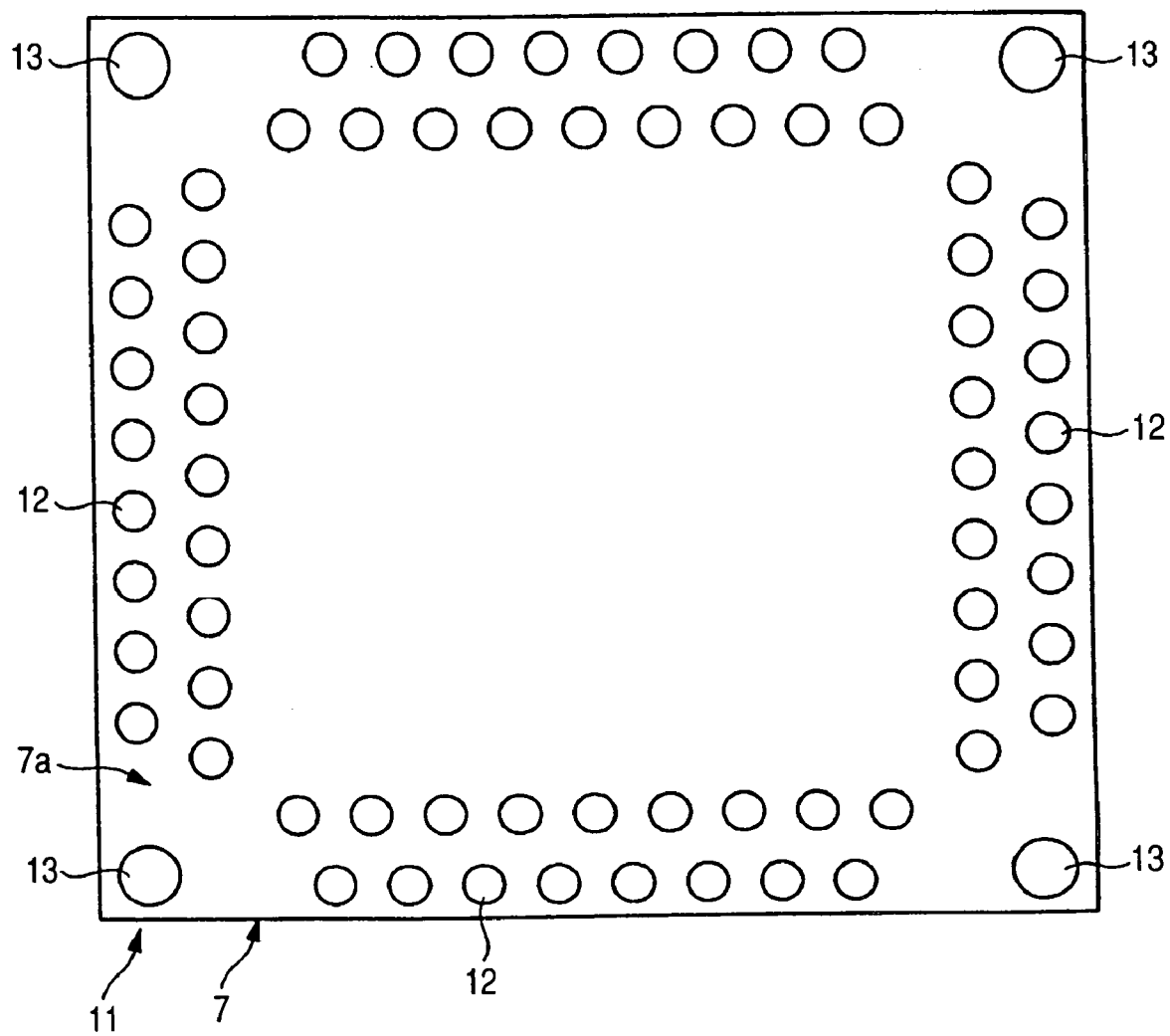
FIG. 20 is a bottom view showing the example of the structure of the semiconductor integrated circuit shown in FIG. 19.
Figure 21:
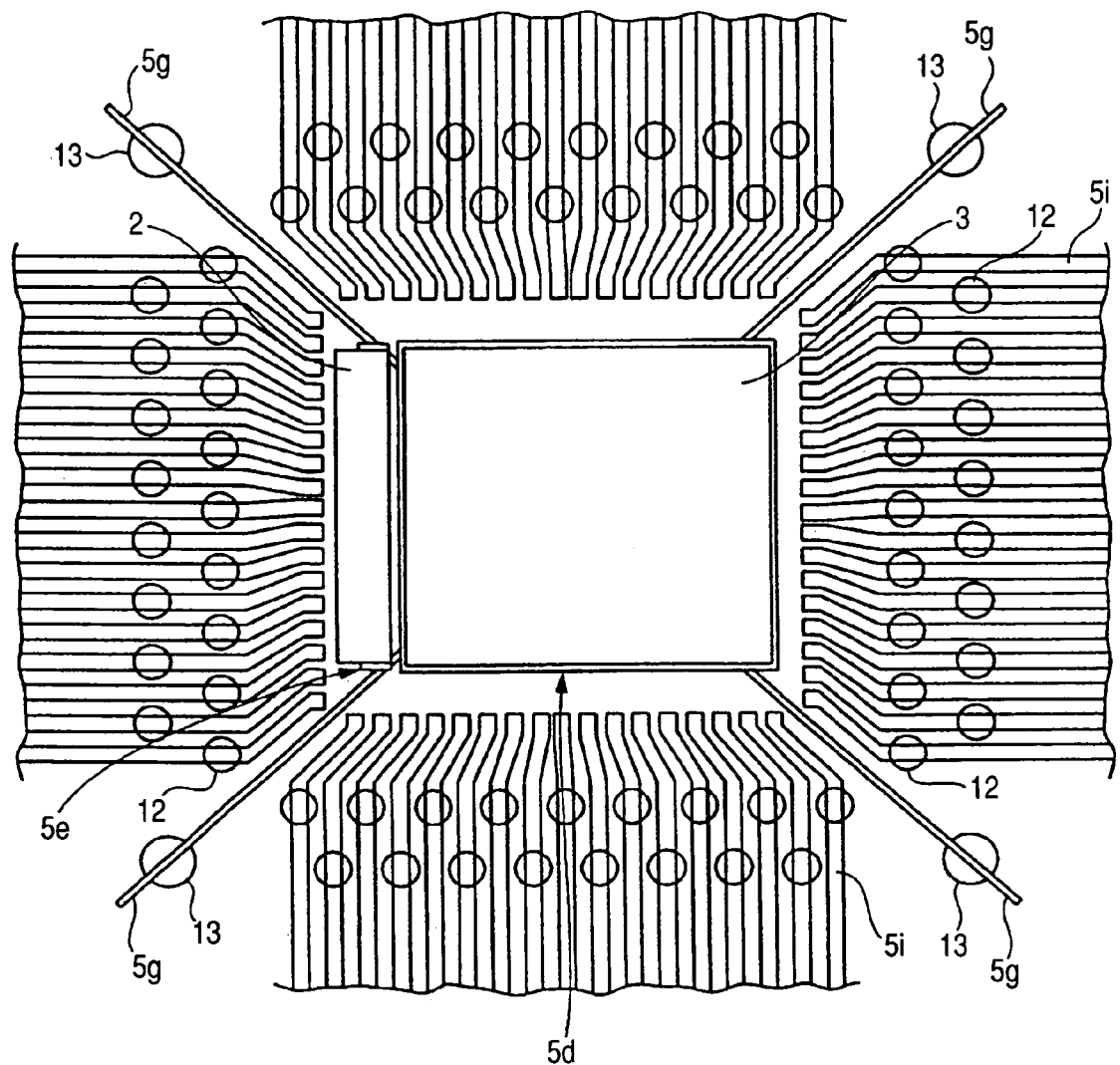
FIG. 21 is a partial plane view showing an example of a relationship when a lead array and an external terminal array in the semiconductor integrated circuit shown in FIG. 19.

FIG. 19 is a sectional view showing an example of a structure of a semiconductor integrated circuit according to Embodiment 2 of the invention, FIG. 20 is a bottom view showing an example of a structure of the semiconductor apparatus shown in FIG. 19 and FIG. 21 is a partial plane view showing an example of a relationship between a lead array and an external terminal array in the semiconductor integrated circuit shown in FIG. 19.

The semiconductor integrated circuit of Embodiment 2 shown in FIG. 19 is SIP 11 in which the microcomputer chip 3 and SDRAM 2 are arranged to align laterally similar to SIP 1 of Embodiment 1, and a difference from SIP 1 of Embodiment 1 resides in that an outer shape of the semiconductor integrated circuit is constituted not by the QFP type but by a QFN (Quad Flat Non-leaded Package) type.

That is, SIP 11 of Embodiment 2 is a semiconductor package of the QFN type and as shown by FIG. 20, a plurality of bump electrodes 12 constituting outer terminal thereof are arranged to align a peripheral edge portion of the rear face 7*a* of the seal member 7. Further, according to SIP 11 of Embodiment 2, multipin formation is achieved similar to SIP 1 of Embodiment 1 and therefore, the plurality of bump electrodes 12 are arranged to align in two rows in a zigzag shape at the peripheral edge portion of the rear face 7*a* of the seal member 7.

Further, as shown by FIG. 19, the respective bump electrodes 12 are bonded to portions 5*i* of lead portions (leads) 5*i* projected to the rear face side, further, as shown by FIG. 21, the respective bump electrodes 12 are bonded to the lead portions 5*i* to align in two rows in a zigzag shape such that the bump electrodes 12 are not shortcircuited between the contiguous lead portions 5*i*.

Further, the hang leads 5*g* arranged at the four corner portions are respectively bonded with reinforcing terminals 13.

Other structure in SIP 11 of the QFN type according to Embodiment 2 is similar to that of SIP 1 of the QFP type according to Embodiment 1 and therefore, a duplicated explanation thereof will be omitted.

Further, also an effect achieved by SIP 11 of the QFN type according to Embodiment 2 is similar to an effect of SIP 1 of the QFP type according to Embodiment 1 and therefore, a duplicated explanation will be omitted.

(Embodiment 3)

Figure 22:
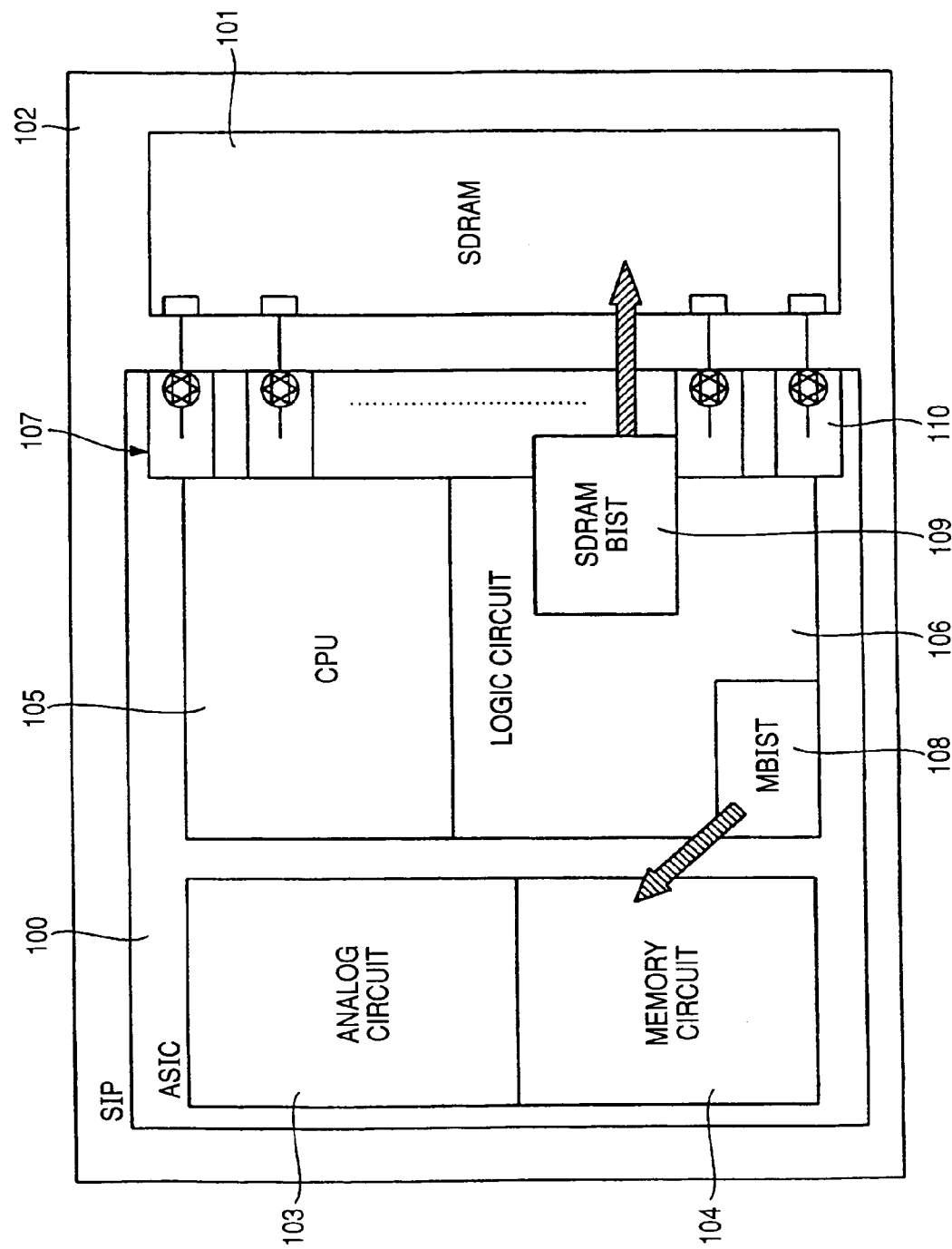
FIG. 22 is a diagram showing a constitution of a semiconductor integrated circuit according to Embodiment 3 of the invention.
Figure 23:
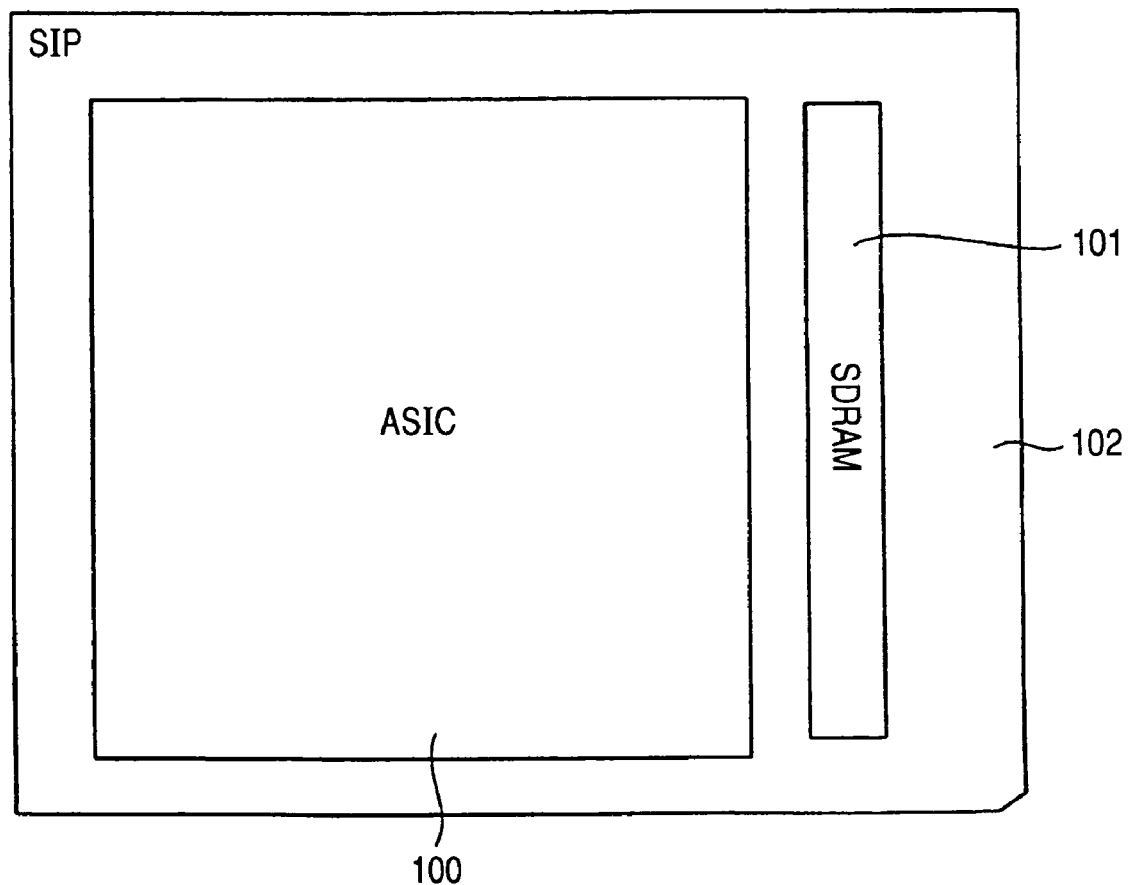
FIG. 23 is a diagram showing an arrangement of respective chips in the semiconductor integrated circuit according to Embodiment 3 of the invention.

FIG. 22 is a conceptual diagram showing a total constitution of a semiconductor integrated circuit of Embodiment 3 according to the invention and FIG. 23 is a conceptual diagram showing an arrangement of ASIC and SDRAM in a package in the semiconductor integrated circuit of Embodiment 3.

First, an example of a constitution of a semiconductor integrated circuit of Embodiment 3 will be explained. The semiconductor integrated circuit of Embodiment 3 is considered to be SIP 102 mounted with, for example, ASIC (system chip) 100 and SDRAM (memory chip) 101 in a single package (for example, QFP) and is constituted by ASIC (Application Specific Integrated Circuit) 100 including an analog circuit 103, a circuit memory 104, CPU (Central Processing Unit) 105, a logic circuit 106, an IO (Input/Output) portion 107, MBIST (Memory Built In Self Test) 108, SDRAMBIST (Synchronous Dynamic Random Access Memory Built In Self Test) 109 and SDRAM (Synchronous Dynamic Random Access Memory) 101. The IO portion 107 in ASIC 100 is constituted by an input/output buffer 110 having a plurality of control signal inputs and other buffer.

Signal lines which are connected only between ASIC 100 and SDRAM 101 and need not connect to an external terminal of SIP 102 (for example, data signal, address signal, control signal, clock signal of SDRAM 101) are connected to the input/output buffer 110 having the control signal inputs at inside of ASIC 100. The input/output buffer 110 having the control signal inputs are a buffer capable of determining IO leakage of a terminal.

MBIST 108 is a circuit for testing the memory circuit 104 by generating a test pattern at inside thereof. SDRAMBIST 109 is a circuit for testing SDRAM 101 by generating a test pattern at inside thereof. As items of test of SDRAM 101, for example, X-MARCH, Y-MARCH, Pause test, Disturb test are executed. A control signal of the IO leakage determining signal to the input/output buffer 110 having the control signal inputs may be provided at inside of SDRAMBIST 109 or may be included in a test mode circuit (boundary scan circuit).

Further, ASIC 100 as the system chip may be a semiconductor chip having a processing function of CPU, a general purpose processor, DSP, and SDRAM 101 as the memory chip may be a semiconductor chip having a memory function of normal DRAM, SRAM, involatile memory (Flash memory or the like).

FIG. 23 shows an arrangement of respective chips of SIP 102 mounted with ASIC 100 and SDRAM 101 in a single package of QFP (Quad Flat Package).

Figure 24:
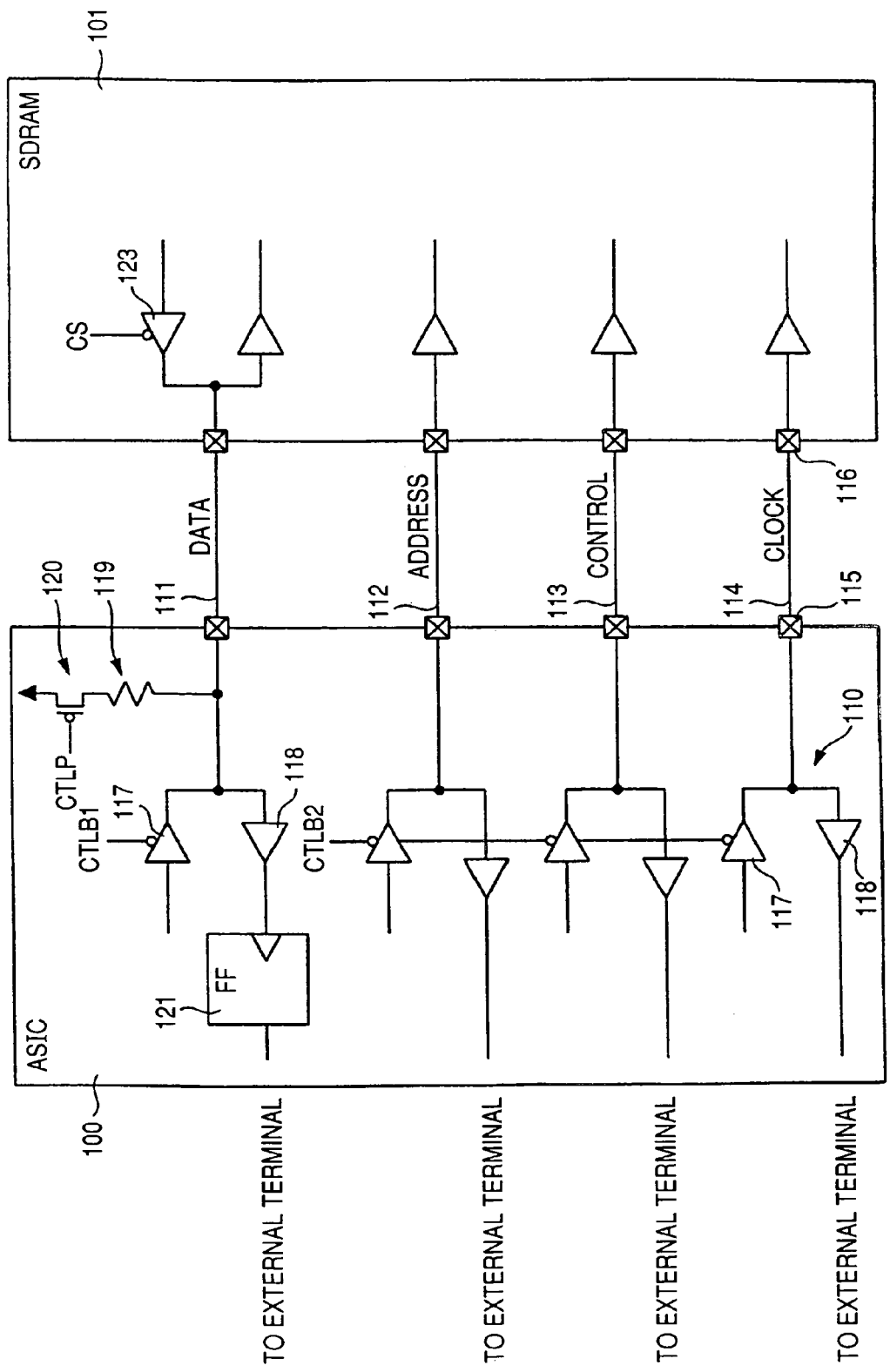
FIG. 24 is a diagram showing details of a buffer portion having a control signal input in a portion of connecting signal lines of ASIC and SDRAM.

FIG. 24 is a diagram showing details of a buffer portion having a control signal input at a signal line connecting portion between ASIC 100 and SDRAM 101. As shown by FIG. 24, a data 111, an address 112, a control 113, and a clock 114 are signal lines connected only between chips of ASIC 100 and SDRAM 101 and not connected to an external terminal of SIP 102. The respective signal lines are connected between terminals (first terminals) on a side of ASIC 100 and terminals (second terminals) on a side of SDRAM 101 by wire bonding or the like.

The input/output buffer 110 having the control signal inputs is constituted by an output buffer 117 of a tristate type and an input buffer 118. The output buffer 117 is inputted with control signals CTLB 1, CTLB 2, by making the control signals CTLB 1, CTLB 2 ON, a terminal 115 and a terminal 116 are charged or discharged to a level of "0" or "1", and by making the control signals CTLB 1, CTLB 2 OFF, the terminal 115 and the terminal 116 are brought into a high impedance state.

When a pull up circuit 119 or a pull down circuit (not illustrated) is provided at an input/output buffer as in the data 111, a switch 120 is provided and a control of ON/OFF is made to be able to execute by a control signal CTLP.

Further, an output of the input buffer 118 may be outputted to an external terminal of SIP 102 via a terminal (third terminal) of ASIC 100 as it is, or a detecting signal may be held by FF (flip flop) 121.

Next, an explanation will be given of an IO leakage test method using the input/output buffer 110 having the control signal inputs in reference to FIG. 24. First, data is written to a portion of detecting IO leakage (terminals 115, 116) from a side of a chip (ASIC 100) connected to an external terminal of SIP 102 by constituting the data by "0" or "1" and making the control signals CTLB 1, CTLB 2 ON. At this occasion, when the pull up circuit 119 is attached, the switch 120 is made OFF by the control signal CTLP. Further, as in the data 111, when there is an output buffer 123 on a side of SDRAM 101, a control signal CS is made to be OFF also on a side of SDRAM 101.

Further, when power source routes of ASIC and SDRAM are separated and respectively allocated to external terminals independent from each other, by making the power source on the side of SDRAM OFF, the output buffer of SDRAM can be made to be OFF similar to the case of making the control signal CS OFF.

Next, by making the control signals CTLB 1, CTLB 2 OFF, the terminals 115, 116 are brought into the high impedance state.

Further, after elapse of a certain constant time period, data of a charged portion (terminals 115, 116) is read by an input buffer 118, and is outputted to outside of ASIC 100. At this occasion, when leakage of charge is brought about at the terminals 115, 116, a result different from an expected value is shown, thereby, presence or absence of IO leakage is determined.

When the system chip is ASIC or CPU, it is general to bring in the input/output buffer 110 having the control signal input and a control circuit thereof as BIST at inside of the system chip, however, a similar function can also be inserted by utilizing a CS terminal to a side of a memory chip of SDRAM or Flash memory.

Figure 25:
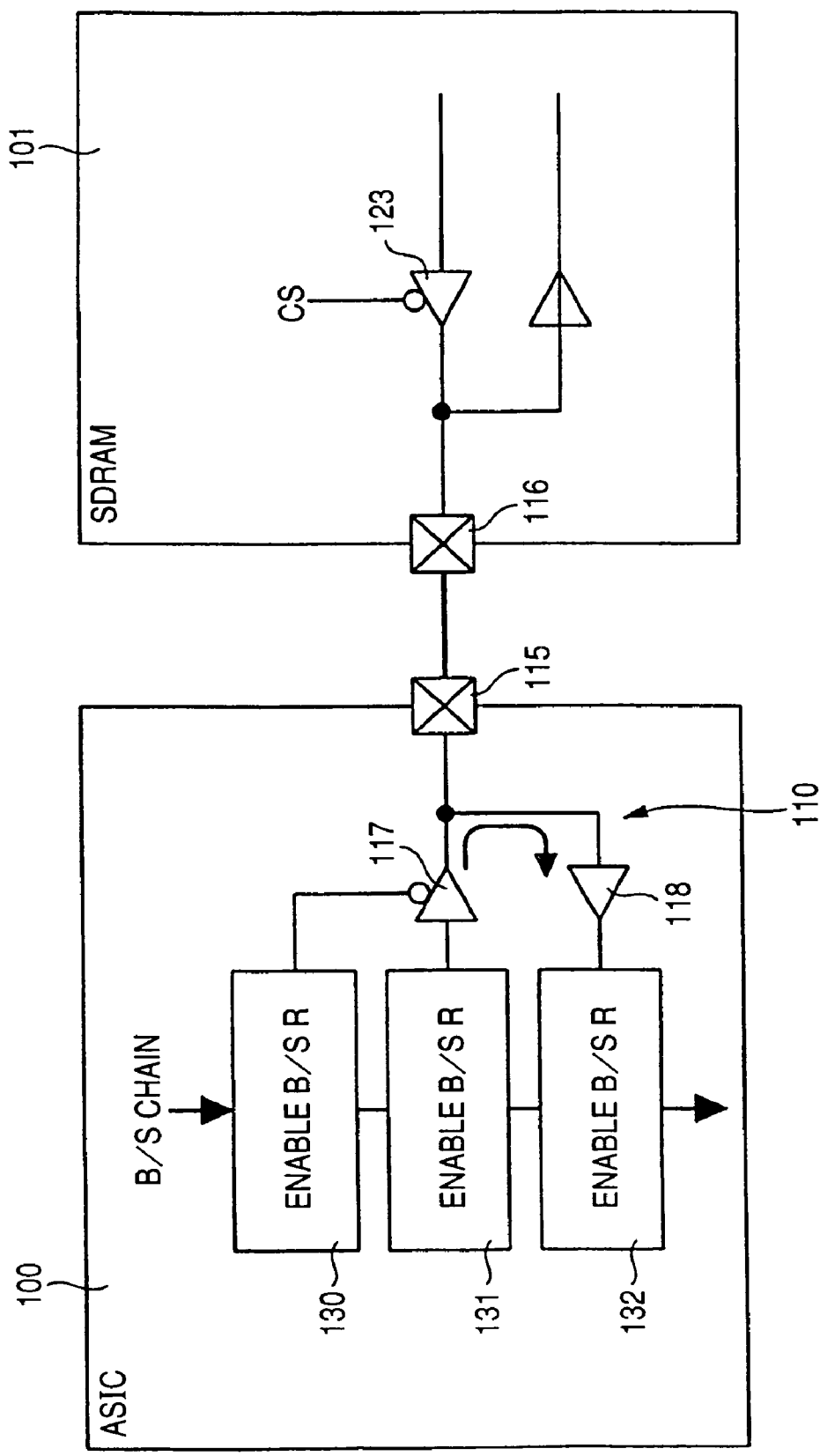
FIG. 25 is a diagram showing a constitution by a boundary scan system in Embodiment 3 of the invention.

Further, the input/output buffer 110 having the control signal input and the control circuit can be applied to the boundary scan test system. FIG. 25 shows a constitution example when applied to the boundary scan system. As shown by FIG. 25, a B/S chain comprising an enable B/SR (boundary scan register) 130, an output B/SR 131, an input B/SR 132 is provided at inside of ASIC 100, connected to the input/output buffer 110 having the control signal input, and the IO leakage test is carried out by utilizing detour of data from the output buffer 117 to the input buffer 118.

An input/output buffer size of the input/output buffer 110 having the control signal input can be reduced in accordance with an object thereof and small area formation can be realized.

A method of outputting a result of the IO leakage test to outside of the chip may be either of a register (FF) type of FF 121 or a through type for outputting the result to outside as it is, and the result can be detected from outside by a tester. Therefore, a restriction in view of a circuit is not present.

When the input/output buffer 110 having the control signal input is attached to a side of a general purpose processor as a system chip, the technology is applicable to between the general purpose processor and a memory (custom memory, function memory).

The method is applicable to a terminal used only at inside thereof of data bus, control signal, SIO terminal between the general purpose processor and a custom processor.

Figure 26:
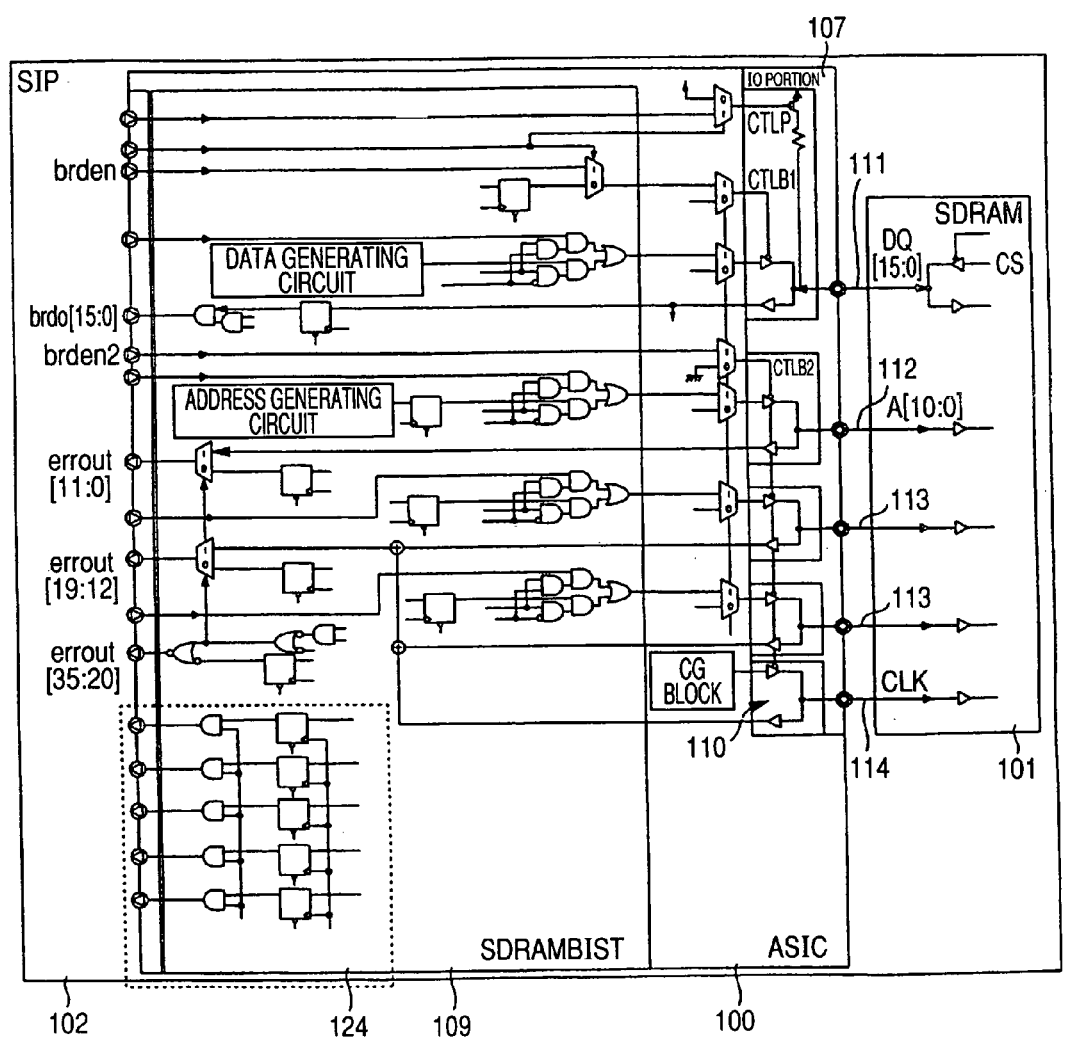
FIG. 26 is a diagram showing a total constitution of the semiconductor integrated circuit according to Embodiment 3 of the invention.

FIG. 26 shows an example of a total constitution of SIP 102 using the input/output buffer 110 having the control signal input according to the embodiment. FIG. 26 shows a case of bringing the input/output buffer 110 having the control signal input and the control circuit as BIST at inside of ASIC 100. In FIG. 26, notations brden, brden 2 designate control signals for determining the IO leakage. Notation brdo designates an IO leakage detecting signal output of the register (FF) type, notation errout designates an IO leakage test detecting signal output of a bypass (through mode) type. SDRAMBIST 109 includes a circuit 124 for testing SDRAM 101 of X-MARCH, Y-MARCH, Pause test, Disturb test or the like in a test mode other than the IO leakage test circuit.

Next, an explanation will be given of details of the IO leakage test utilizing the input/output buffer 110 having the control signal input according to the embodiment.

Figure 27:
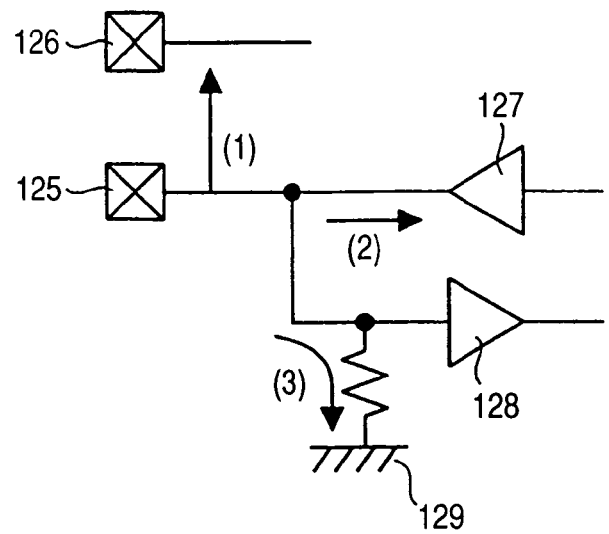
FIG. 27 is an explanatory view showing a kind of IO leakage at a terminal (pin) of a semiconductor chip according to Embodiment 3 of the invention.

FIG. 27 is an explanatory view showing a kind of the IO leakage at a terminal (pin) of a semiconductor chip. In IO leakage at a pin 125 at inside of the semiconductor chip, there are (1) leakage between pins, (2) IO buffer leakage, (2) power source/GND leakage. (1) Leakage between pins is leakage between the pin 125 and a contiguous pin 126. (2) IO buffer leakage is leakage between an output buffer 127 and an input buffer 128 which causes a failure of a transistor constituted by the output buffer 127 and the input buffer 128. (3) Power source/GND leakage is leakage between a leakage object and the power source or GND (ground) 129.

(1) In order to detect the leakage between pins, the leakage can be detected by writing data of " . . . 0000" 1"

"0000 . . . " or " . . . 1111" 0" 1111 . . . " to each pin as a test pattern. Further, data of "1" or "0" shows data of the pin 125 constituting a detecting object.

Figure 28:
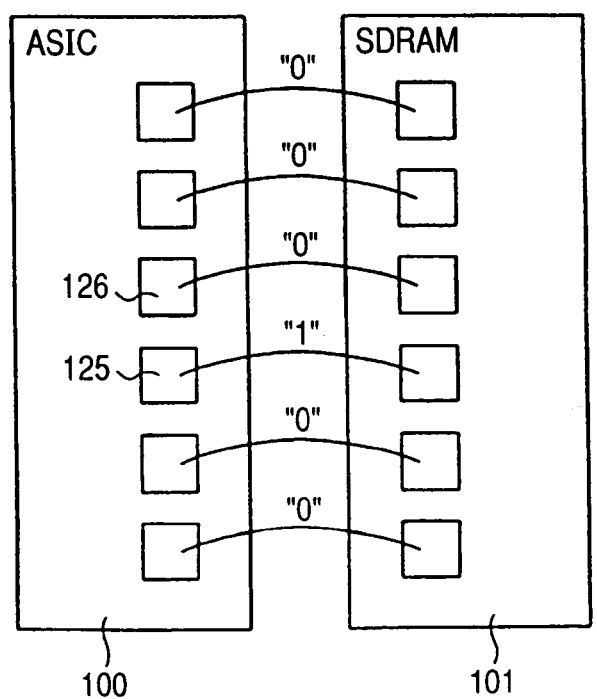
FIG. 28 is a diagram for explaining a method of testing leakage according to Embodiment 3 of the invention.

FIG. 28 shows the behavior. In FIG. 27, the object of detecting leakage is the pin 125. In this case, "1", is written to the pin 125 and data of "0" is written to other pins including the contiguous pin 126. That is, the leakage between pins can be detected by charging or discharging by reversing data of the detecting object pin 125 and the contiguous pin 126.

(2) In order to detect the IO buffer leakage, the leakage can be detected by charging or discharging, for example, data of " . . . XXXX" 1" XXXX . . . " or " . . . XXXX" 0" XXXX . . . " to each pin as the test pattern. Further, data of "1" or "0" shows data of the pin 125 constituting the detecting object, and "X" signifies that "X" may be either of data of 1/0. That is, the data is not related to data of the contiguous pin 126.

(3) In order to detect the power source/GND leakage, the leakage to GND can be detected by charging, for example, data of " . . . XXXX" 1" XXXX . . . " to each pin as the test pattern. Further, leakage to the power source can be detected by writing data of " . . . XXXX" 0" XXXX . . . " to each pin.

Therefore, the following two patterns are carried out for each internally connected pin as the test pattern of mass production test of an SIP product.

" . . . 0000" 1" 0000 . . . "; pattern of confirming leakage between pins and leakage to power source VSS (GND).

" . . . 1111" 0" 1111 . . . ": pattern of confirming leakage between pins and leakage to power source VDD.

Further, the following two patterns are carried out as a test pattern of an efficient test.

" . . . 1010" 1" 01010 . . . ": pattern of confirming leakage between contiguous pins and leakage to power source VSS (GND).

" . . . 0101" 0" 10101 . . . ": pattern of confirming leakage between contiguous pins and leakage to power source VDD.

When it is assumed that leakage between pins is brought about only between contiguous pins, IO leakage can be detected by the above-described two patterns.

Next, an explanation will be given of a way of calculating a predetermined time period when a connecting terminal is charged or discharged by the input/output buffer 110 having the control signal input and thereafter the connecting terminal is brought into the high impedance state to hold for the predetermined time period.

Figure 29:
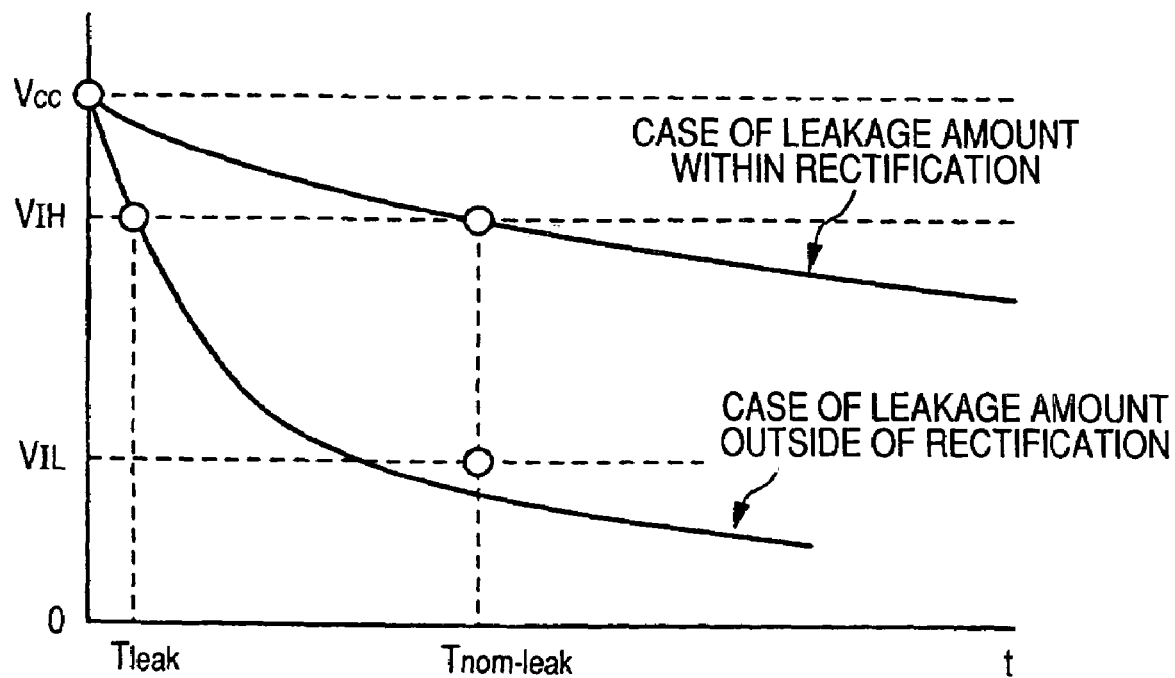
FIG. 29 is a diagram showing a change over time of a voltage of a connecting terminal when the connecting terminal is charged to a voltage Vcc and thereafter brought into a high impedance state according to Embodiment 3 of the invention.

FIG. 29 shows a diagram showing a change over time of a voltage of a connecting terminal when the connecting terminal is charged to a voltage Vcc and thereafter brought into the high impedance state. In FIG. 29, the ordinate designates a voltage of the connecting terminal and the abscissa designates an elapse timer period t. As shown by FIG. 29, when a leakage amount of the connecting terminal is within a rectification, until elapse of a time period $T_{nom-leak}$, the voltage of the connecting terminal is maintained to be equal to or higher than a high level (data "1") $V_{IH}$. However, when the leakage amount of the connecting terminal is outside of the rectification, the high level (data "1") $V_{IH}$ can not be maintained only by a time period of $T_{leak}$ and after elapse of time period $T_{nom-leak}$, the voltage of the connecting terminal becomes a low level (data "0") $V_{IL}$. Therefore, the leakage test can be carried out by charging the connecting terminal to voltage Vcc by the output buffer, thereafter, constituting the high impedance state and by reading the voltage of the connecting terminal by the input buffer after elapse of the time period of $T_{nom-leak}$.

Although a specific explanation has been given of the invention which have been carried out by the inventors based on the embodiments of the invention as described above, the invention is not limited to the embodiments of the invention but can naturally be changed variously within the range not deviated from a gist thereof.

For example, although according to Embodiments 1, 2, an explanation has been given of a case in which the two semiconductor chips of the microcomputer chip 3 and SDRAM 2 are arranged to align laterally, a semiconductor integrated circuit of Embodiments 1, 2 may be arranged with two or more of semiconductor chips to align laterally, and a number of the semiconductor chips is not limited to two.

Further, although according to Embodiment 1, an explanation has been given of the semiconductor integrated circuit by taking an example of the case of the QFP type, the semiconductor integrated circuit may be of a QFJ (Quad Flat J-leaded package) type or the like and a shape of the lead is not limited.

Further, although according to Embodiment 3, an explanation has been given of a case of applying the invention which has mainly be carried out by the inventors to the semiconductor integrated circuit constituted by mounting a plurality of semiconductor chips to the signal package which is the technical field to which the invention belongs, the invention is not limited thereto but, for example, applicable to determination of leakage when a plurality of semiconductor products are mounted on a mounting board.

The invention is preferable for an electronic apparatus and a semiconductor integrated circuit.

Further, the invention disclosed in the application is applicable to a semiconductor integrated circuit of SIP or the like constituted by mounting a plurality of semiconductor chips to a single package, particularly, an effect thereof is significant with regard to an SIP product requesting low-price, an SIP product having a small area package or the like.

What is claimed is:

1. A semiconductor device which includes a first semiconductor chip and a second semiconductor chip on a signal package, the first semiconductor chip being a system chip and including a test circuit for testing the second semiconductor chip, and the second semiconductor chip being a memory chip, the first semiconductor chip including:

an input/output buffer having a control signal input and a first terminal coupled to the input/output buffer, the second semiconductor chip including:

a second terminal coupled to the first terminal only at inside of the single package and not coupled to an external terminal of the single package, and the input/output buffer having a function of charging or discharging the first terminal and the second terminal by making a control signal ON, bringing the first terminal and the second terminal into a high impedance state by making the control signal OFF and detecting voltage levels of the first terminal and the second terminal after elapse of a predetermined time period.

2. A semiconductor device which includes a first semiconductor chip and a second semiconductor chip on a signal package, the first semiconductor chip including:

an input/output buffer having a control signal input and a first terminal coupled to the input/output buffer, the second semiconductor chip including:

a second terminal coupled to the first terminal only at inside of the single package and not coupled to an external terminal of the single package, and the input/output buffer having a function of charging or discharging the first terminal and the second terminal by making a control signal ON, bringing the first terminal and the second terminal into a high impedance state by making the control signal OFF and detecting voltage levels of the first terminal and the second terminal after elapse of a predetermined time period.

3. The semiconductor device according to claim 2, wherein the first semiconductor chip further includes:

a third terminal for outputting a detecting signal of the voltage levels of the first terminal and the second terminal detected by the input/output buffer, and wherein the third terminal is coupled to the external terminal of the single package.

4. The semiconductor device according to claim 2, wherein the first semiconductor chip further includes means for maintaining the detecting signal of the voltage levels of the first terminal and the second terminal detected by the input/output buffer.

5. The semiconductor device according to claim 2, wherein the first semiconductor chip is a system chip, and wherein the second semiconductor chip is a memory chip.

6. The semiconductor device which includes a first semiconductor chip and a second semiconductor chip on a signal package, the first semiconductor chip being a system chip and including a test circuit for testing the second semiconductor chip, and the second semiconductor chip being a memory chip, wherein the first semiconductor chip includes a semiconductor element and a plurality of electrodes at a main face thereof, wherein the second semiconductor chip includes a semiconductor element and a plurality of electrodes at a main face thereof and is arranged to align laterally with the first semiconductor chip, wherein a thickness of the second semiconductor chip is thinner than that of the first semiconductor chip, and wherein the semiconductor device further including:

a first chip mounting portion coupled to the first semiconductor chip;

a second chip mounting portion coupled to the semiconductor chip;

a plurality of leads arranged at surroundings of the first semiconductor chip and the second semiconductor chip;

a plurality of conductive first bonding wires for respectively electrically coupling the electrode of the first semiconductor chip and the electrode of the second semiconductor chip; a plurality of conductive second bonding wires for respectively electrically coupling the electrode of the first semiconductor chip and the lead, arranged to ride over the second semiconductor chip and formed with a loop at a position higher than a loop of the first bonding wire; and a seal member for sealing the first semiconductor chip, the second semiconductor chip, the plurality of first bonding wires and the plurality of second bonding wires by a resin.

* * * * *